US012575163B2

(12) United States Patent
Nakamura et al.

(10) Patent No.: US 12,575,163 B2
(45) Date of Patent: Mar. 10, 2026

(54) SEMICONDUCTOR DEVICE INCLUDING CONTROL ELECTRODE WITH THREE CONTROL PARTS

(71) Applicants:Kabushiki Kaisha Toshiba, Tokyo (JP); Toshiba Electronic Devices & Storage Corporation, Tokyo (JP)

(72) Inventors: Mitsutoshi Nakamura, Kawasaki Kanagawa (JP); Masami Nagaoka, Ebina Kanagawa (JP); Kazuya Nishihori, Tokyo (JP); Keita Masuda, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 457 days.

(21) Appl. No.: 18/178,445

(22) Filed: Mar. 3, 2023

(65) Prior Publication Data

US 2024/0105796 A1      Mar. 28, 2024

(30) Foreign Application Priority Data

Sep. 22, 2022    (JP) ................................. 2022-151206

(51) Int. Cl.
*H10D 30/60* (2025.01)
*H10D 64/27* (2025.01)
*H10D 86/00* (2025.01)

(52) U.S. Cl.
CPC ......... *H10D 64/518* (2025.01); *H10D 30/605* (2025.01); *H10D 86/201* (2025.01)

(58) Field of Classification Search
CPC ............... H10D 30/605; H10D 30/673; H10D 30/6733; H10D 30/6744; H10D 64/518; H10D 86/201
See application file for complete search history.

(56) References Cited

U.S. PATENT DOCUMENTS

| | | |
|---|---|---|
| 2012/0132977 A1 | 5/2012 | Seshita |
| 2012/0146109 A1 | 6/2012 | Yamazaki |

(Continued)

FOREIGN PATENT DOCUMENTS

| | | |
|---|---|---|
| JP | S55-135423 A | 10/1980 |
| JP | 2012-138575 A | 7/2012 |

(Continued)

OTHER PUBLICATIONS

Chae, D. H., "Process Design and Simulation Study for Triple-Gate MOSFETs," SMDL Annual Report 1998, 3 pages.

(Continued)

*Primary Examiner* — Nelson Garces
(74) *Attorney, Agent, or Firm* — Kim & Stewart LLP

(57) ABSTRACT

A semiconductor device includes an insulating layer, a semiconductor layer and a control electrode. The semiconductor layer is provided on the insulating layer and includes a first semiconductor region of a first conductivity type, a second semiconductor region of the first conductivity type and a third semiconductor region of a second conductivity type. The third semiconductor region is located between the first semiconductor region and the second semiconductor region. The first to third semiconductor regions are arranged in a first direction along an interface between the insulating layer and the semiconductor layer. The control electrode is provided on the semiconductor layer and includes first to third control parts arranged in the first direction. The first control part is located between the second control part and the third control part. The third semiconductor region is positioned between the insulating layer and the first control part.

16 Claims, 18 Drawing Sheets

(56)                References Cited

U.S. PATENT DOCUMENTS

| | | | |
|---|---|---|---|
| 2017/0213848 A1 | 7/2017 | Nishihori et al. | |
| 2021/0367073 A1* | 11/2021 | Snyder ................. | H10D 62/393 |
| 2021/0375941 A1* | 12/2021 | Lee ................... | H10D 30/0323 |
| 2023/0290876 A1 | 9/2023 | Nakamura et al. | |

FOREIGN PATENT DOCUMENTS

| | | |
|---|---|---|
| JP | 5512498 B2 | 6/2014 |
| JP | 2017-130625 A | 7/2017 |
| JP | 2023-134251 A | 9/2023 |

OTHER PUBLICATIONS

Kawaura, H., "Fabrication and Characterization of 14-nm-Gate-Length EJ-MOSFETs," In Int. Conf. Solid State Devices and Materials, 1997, pp. 572-573 (with Author Index).

Wong, H-S., "Experimental Verification of the Mechanism of Hot-Carrier-Induced Photon Emission in N-MOSFET's Using an Overlapping CCD Gate Structure," in IEEE Electron Device Letters, vol. 13, No. 8, Aug. 1992, pp. 389-391.

Wong, H-S., "Gate Current Injection in MOSFET's with a Split-Gate (Virtual Drain) Structure," in IEEE Electron Device Letters, vol. 14, No. 5, May 1993, pp. 262-264.

Wei, C. J., "Large-Signal Model of Triple-Gate MESFET/PHEMT for Switch Applications," 1999 IEEE MTT-S Digest, pp. 745-748.

Japanese Office Action mailed Oct. 27, 2025 in corresponding Japanese Patent Application 2022-151206 with English Translation, 10 pages.

* cited by examiner

|  | SOURCE (S) | GS | GG | GD | DRAIN (D) | BODY (B) |
|---|---|---|---|---|---|---|
| ON | 0.0V | 3.0V | 3.0V | 3.0V | RF | 0.0V |
| OFF | 0.0V | 0.0V | -3.0V | 0.0V | RF | -3.0V |

FIG. 7A
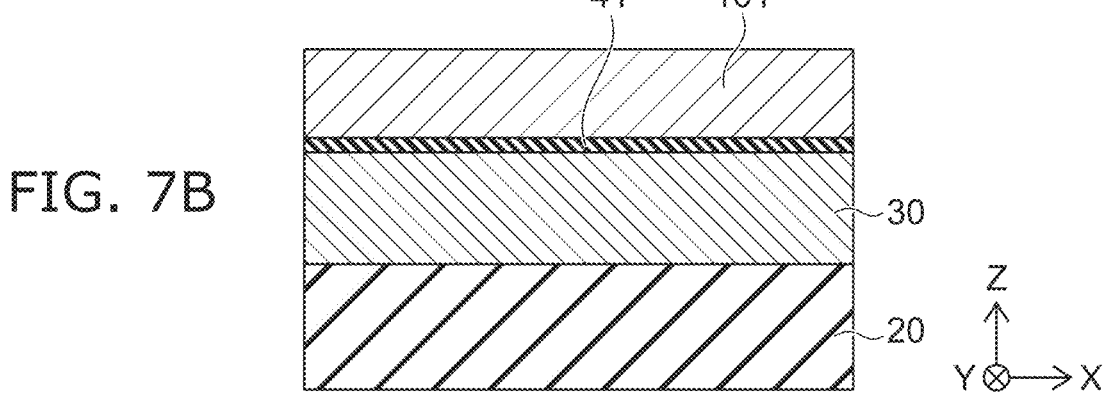
FIG. 7B
FIG. 7C
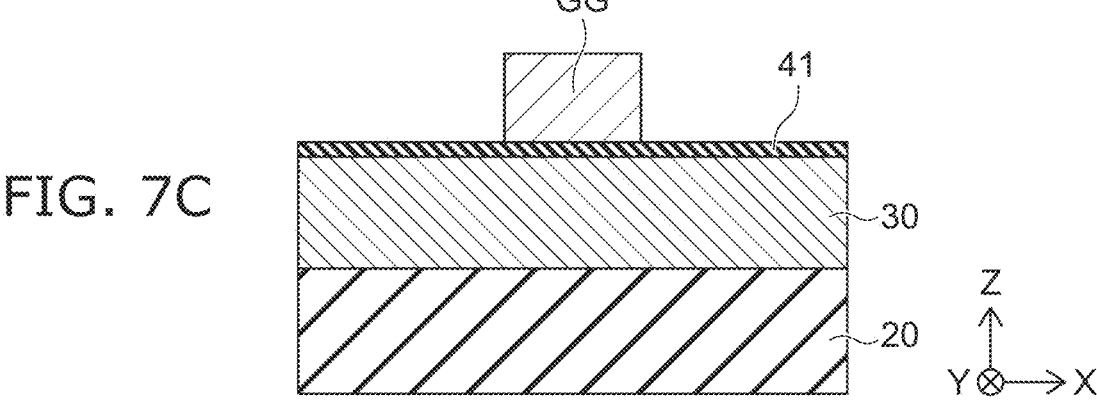

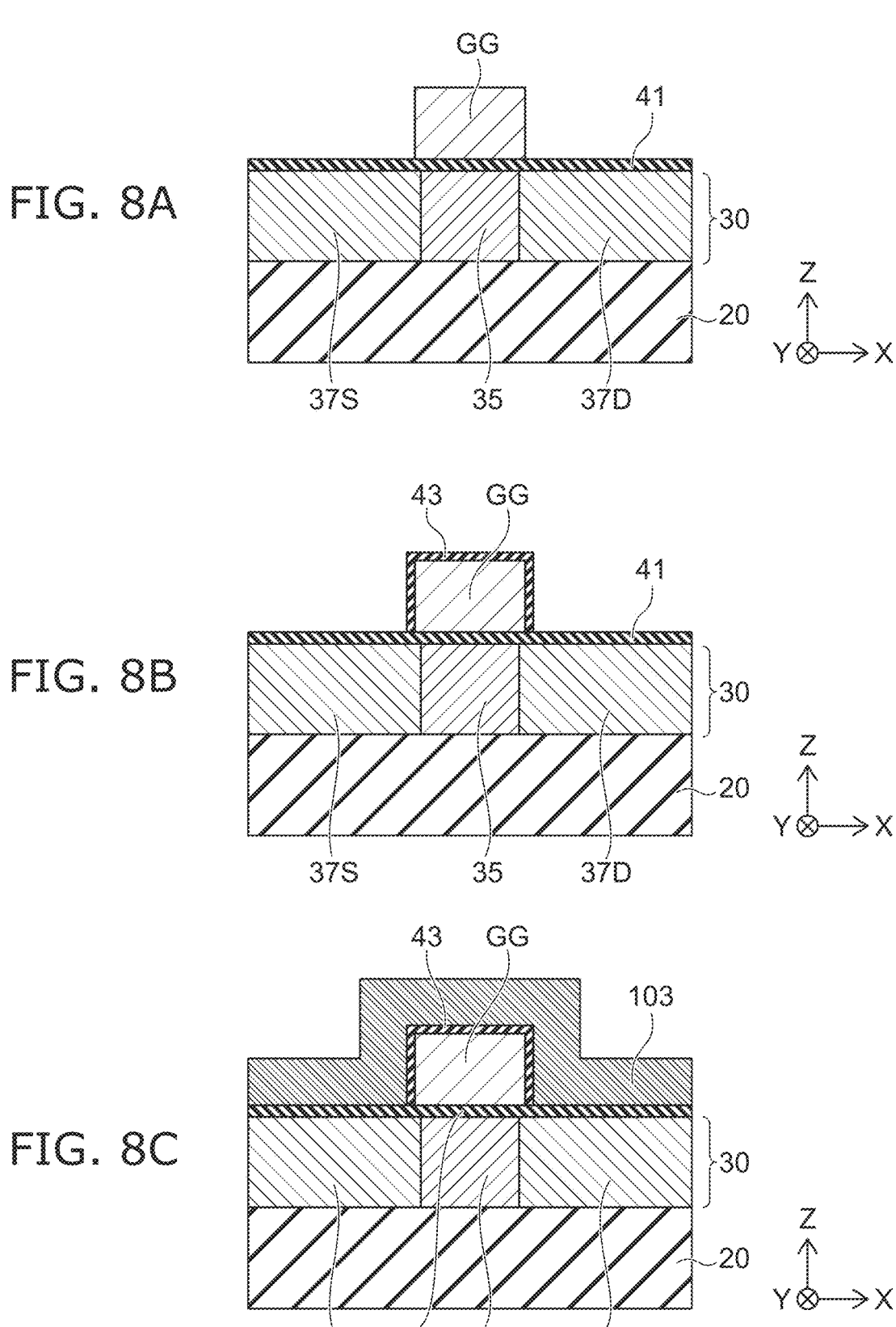

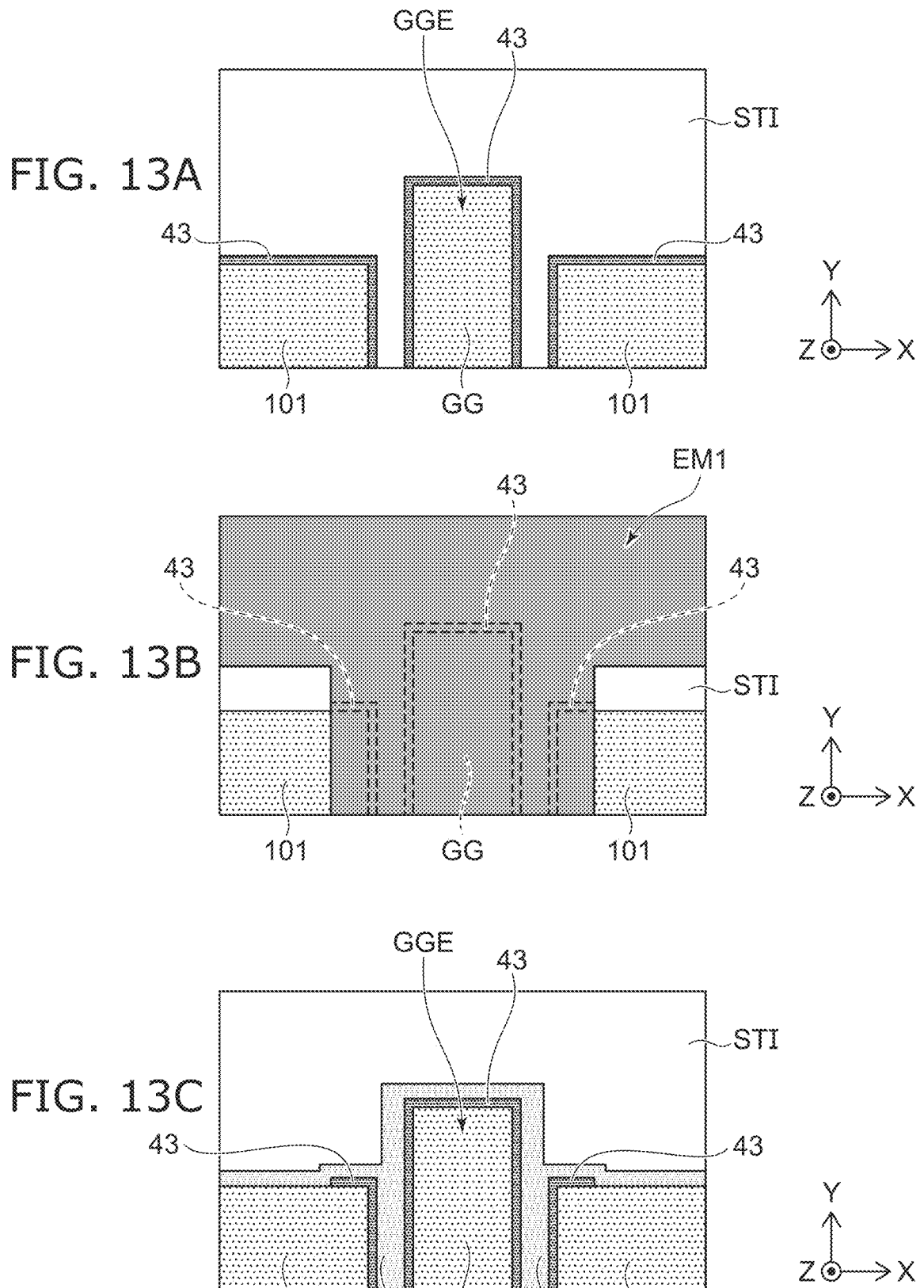

SEMICONDUCTOR DEVICE INCLUDING CONTROL ELECTRODE WITH THREE CONTROL PARTS

CROSS-REFERENCE TO RELATED APPLICATIONS

This application is based upon and claims the benefit of priority from Japanese Patent Application No. 2022-151206, filed on Sep. 22, 2022; the entire contents of which are incorporated herein by reference.

FIELD

Embodiments relate to a semiconductor device.

BACKGROUND

It is desirable for a switching transistor to improve the high-frequency characteristics.

BRIEF DESCRIPTION OF THE DRAWINGS

FIGS. 7A to 16C are schematic views showing manufacturing processes of the semiconductor device 1 according to the embodiment;

DETAILED DESCRIPTION

Figure 1:
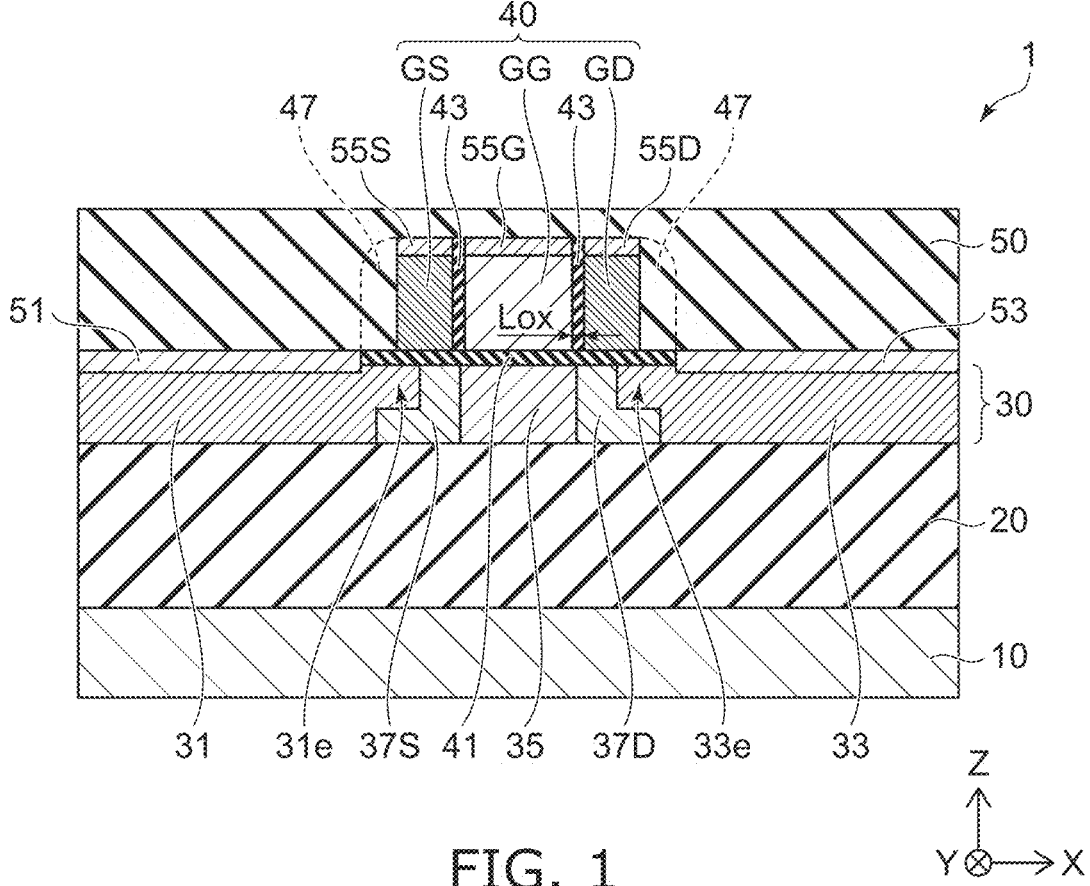
FIG. 1 is a schematic cross-sectional view showing a semiconductor device according to an embodiment.

According to one embodiment, a semiconductor device includes an insulating layer, a semiconductor layer and a control electrode. The semiconductor layer is provided on the insulating layer. The semiconductor layer includes a first semiconductor region of a first conductivity type, a second semiconductor region of the first conductivity type and a third semiconductor region of a second conductivity type. The second semiconductor region is apart from the first semiconductor region. The third semiconductor region is located between the first semiconductor region and the second semiconductor region. The first to third semiconductor regions are arranged in a first direction along an interface between the insulating layer and the semiconductor layer. The control electrode is provided on the semiconductor layer with a first insulating film interposed. The control electrode is electrically insulated from the semiconductor layer by the first insulating film. The control electrode includes first to third control parts arranged in the first direction. The first control part is located between the second control part and the third control part. The first control part is electrically insulated from the second and third control parts by a second insulating film. The third semiconductor region is positioned between the insulating layer and the first control part.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a MOS transistor having an SOI (Silicon on Insulator) structure. The semiconductor device 1 is used as, for example, a high-frequency switching device.

As shown in FIG. 1, the semiconductor device 1 includes, for example, a substrate 10, an insulating layer 20, a semiconductor layer 30, a control electrode 40, and an inter-layer insulating film 50. The substrate 10 is a semiconductor substrate or an insulating substrate. The substrate 10 is, for example, a silicon substrate. The embodiment is not limited to the example; the substrate 10 and the insulating layer 20 may be, for example, a continuous body.

The insulating layer 20 is provided on the substrate 10. The insulating layer 20 is, for example, a silicon oxide layer. The semiconductor layer 30 is provided on the insulating layer 20. The semiconductor layer 30 is, for example, a silicon layer.

The control electrode 40 is provided on the semiconductor layer 30 with a first insulating film 41 interposed. The first insulating film 41 electrically insulates the control electrode 40 from the semiconductor layer 30. The first insulating film 41 is, for example, a gate insulating film. The first insulating film 41 is, for example, a silicon oxide film. The inter-layer insulating film 50 covers the control electrode 40 and the semiconductor layer 30. The inter-layer insulating film 50 is, for example, a silicon oxide film.

The semiconductor layer 30 includes a first semiconductor region 31 of a first conductivity type, a second semiconductor region 33 of the first conductivity type, and a third semiconductor region 35 of a second conductivity type. In the following description, the first conductivity type is an n-type, and the second conductivity type is a p-type.

The first semiconductor region 31 is, for example, an n-type source region. The second semiconductor region 33 is, for example, an n-type drain region. The third semiconductor region 35 is, for example, a p-type body region. The first semiconductor region 31, the second semiconductor region 33, and the third semiconductor region 35 are arranged in a first direction, e.g., an X-direction, that is along the interface between the insulating layer 20 and the semiconductor layer 30. The third semiconductor region 35 is provided between the first semiconductor region 31 and the second semiconductor region 33. The third semiconductor region 35 is positioned between the insulating layer 20 and the control electrode 40.

The control electrode 40 includes a first control part GG, a second control part GS, and a third control part GD. The first control part GG, the second control part GS, and the third control part GD are arranged in the first direction. The first control part GG is provided between the second control part GS and the third control part. The second control part GS is provided at, for example, the source side; and the third control part GD is provided at, for example, the drain side. The first direction is a so-called gate-length direction.

The first control part GG faces the second control part GS and the third control part GD via a second insulating film 43. The second insulating film 43 electrically insulates the second and third control parts GS and GD from the first control part GG.

Sidewalls 47 are provided at, for example, two sides of the control electrode 40. The sidewalls 47 are provided on the side surfaces of the second and third control parts GS and GD. The sidewalls 47 are, for example, silicon oxide films or silicon nitride films.

The semiconductor layer 30 further includes a fourth semiconductor region 37S of the second conductivity type and a fifth semiconductor region 37D of the second conductivity type. The fourth semiconductor region 37S is located between the first semiconductor region 31 and the third semiconductor region 35. The fifth semiconductor region 37D is located between the second semiconductor region 33 and the third semiconductor region 35. The fourth semiconductor region 37S and the fifth semiconductor region 37D are so-called halo regions and include a second-conductivity-type impurity with a higher concentration than a concentration of the second-conductivity-type impurity in the third semiconductor region 35.

As shown in FIG. 1, the third semiconductor region 35 is located between the insulating layer 20 and the first control part GG. The fourth semiconductor region 37S is located, for example, between the insulating layer 20 and the second control part GS. The fifth semiconductor region 37D is located, for example, between the insulating layer 20 and the third control part GD.

The first semiconductor region 31 contacts the first insulating film 41. The first semiconductor region 31 includes an extension portion 31e positioned under the sidewall 47. The extension portion 31e extends along the first insulating film 41 between the insulating layer 20 and the second control part GS. In other words, the extension portion 31e extends between the fourth semiconductor region 37S and the first insulating film 41.

The second semiconductor region 33 also contacts the first insulating film 41. The second semiconductor region 33 includes an extension portion 33e positioned under another sidewall 47. The extension portion 33e extends along the first insulating film 41 between the insulating layer 20 and the third control part GD. In other words, the extension portion 33e extends between the fifth semiconductor region 37D and the first insulating film 41.

The semiconductor device 1 further includes silicide regions 51, 53, 55S, 55G, and 55D. The silicide region 51 is provided on the first semiconductor region 31. The silicide region 53 is provided on the second semiconductor region 33. The silicide region 55G is provided on the first control part GG. The silicide regions 55S and 55D are provided respectively on the second and third control parts GS and GD. When the second control part GS and the third control part GD include resistances that serve as at least a portion of a gate resistance Rgs and at least a portion of a gate resistance Rgd (see FIG. 4A), the silicide regions 55S and 55D may be provided partially on the second and third control parts GS and GD, respectively. Hereinbelow, the silicide regions 55G, 55S, and 55D may be described as the silicide region 55 without differentiating.

Figure 2:
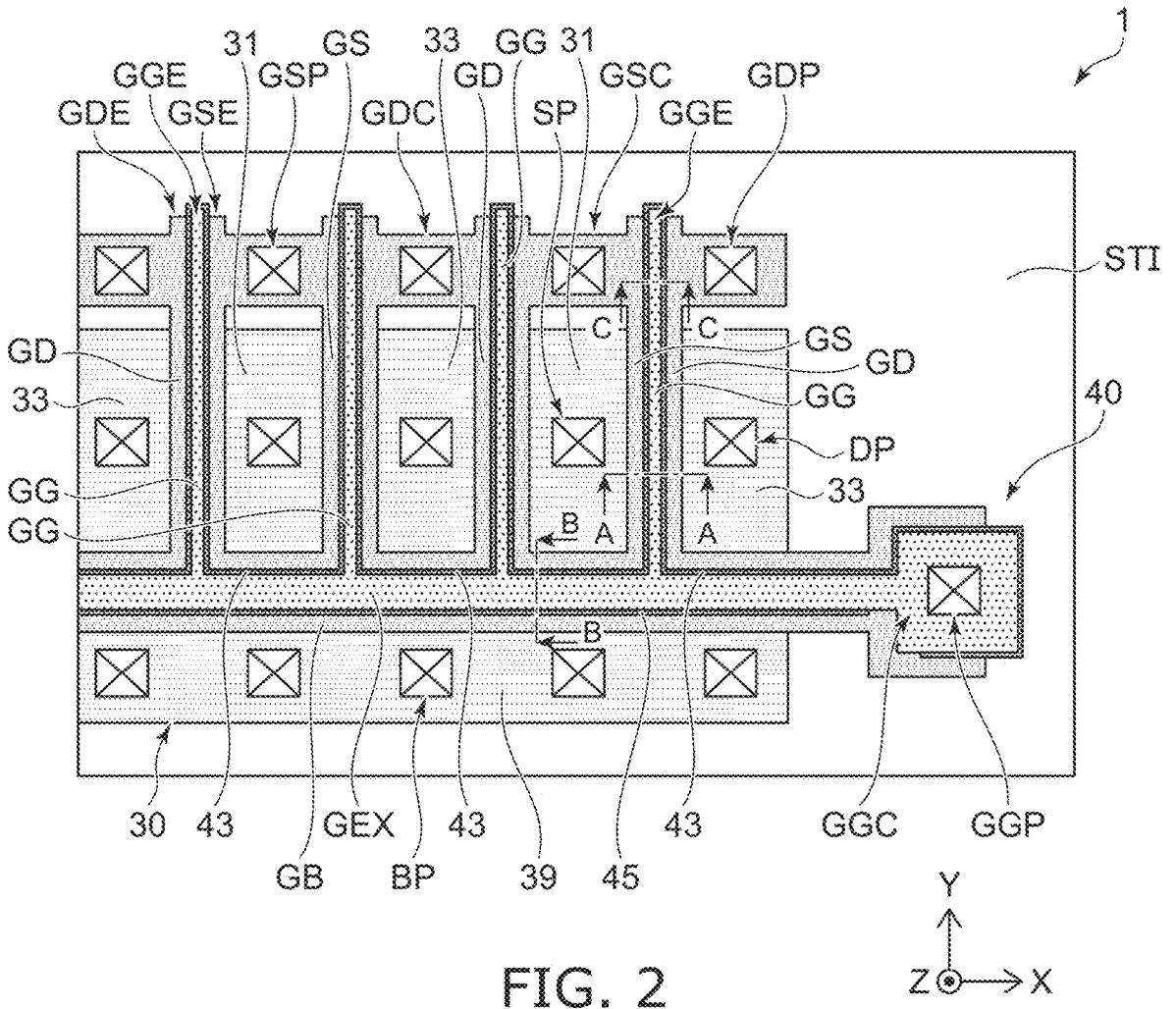
FIG. 2 is a schematic plan view showing the semiconductor device according to the embodiment.

FIG. 2 is a schematic plan view showing the semiconductor device 1 according to the embodiment. FIG. 2 is a plan view showing the control electrode 40 on the semiconductor layer 30. FIG. 1 is a cross-sectional view along line A-A shown in FIG. 2.

As shown in FIG. 2, the semiconductor layer 30 is surrounded with STI (Shallow Trench Isolation) in the plan view. The STI is, for example, a silicon oxide layer. The control electrode 40 includes the multiple first control parts GG and a draw-out portion GEX. The multiple first control parts GG extend in a second direction, e.g., a Y-direction, on the semiconductor layer 30. The draw-out portion GEX extends in the X-direction on the semiconductor layer 30. The multiple first control parts GG are linked to the draw-out portion GEX.

Each first control part GG is provided with two sides in the X-direction. The second control part GS and the third control part GD are provided respectively at the two sides of the first control part GG and face the first control part GG via the second insulating film 43. The second control part GS and the third control part GD also face the draw-out portion GEX via the second insulating film 43.

The first control part GG, the second control part GS, and the third control part GD respectively include end portions GGE, GSE, and GDE extending onto the STI. The end portion GSE of the second control part GS is apart from the end portion GDE of the third control part GD. The end portion GGE of the first control part GG is provided between the end portions GSE and GDE.

The semiconductor device 1 further includes contact plugs GGP, GSP, GDP, SP, DP and BP. The control electrode 40 further includes contact portions GGC, GSC and GCD.

The contact portion GGC is provided on the STI. The draw-out portion GEX extends over the STI and is linked to the contact portion GGC. The contact plug GGP is connected to the contact portion GGC via the silicide region 55G (see FIG. 1). The contact plug GGP extends through the inter-layer insulating film 50 (see FIG. 1) and electrically connects the first control part GG and a control interconnect provided on the inter-layer insulating film 50 (see FIG. 4A).

The contact portion GSC is provided on the STI. The contact portion GSC is linked to the end portion GSE of the second control part GS. The contact plug GSP is connected to the contact portion GSC via the silicide region 55S (see FIG. 1). The contact plug GSP extends through the inter-layer insulating film 50 (see FIG. 1) and electrically connects the second control part GS and another control interconnect located on the inter-layer insulating film 50 (see FIG. 4A).

The contact portion GDC is provided on the STI. The contact portion GDC is linked to the end portion GDE of the third control part GD. The contact plug GDP is connected to the contact portion GDC via the silicide region 55D (see FIG. 1). The contact plug GDP extends through the inter-layer insulating film 50 (see FIG. 1) and electrically connects the third control part GD and another control interconnect located on the inter-layer insulating film 50 (see FIG. 4A).

The first semiconductor region 31 and the second semiconductor region 33 are alternately arranged in the first direction, e.g., the X-direction. The first control part GG, the second control part GS, and the third control part GD are provided between the first semiconductor region 31 and the second semiconductor region 33 in the plan view.

The contact plug SP is connected to the first semiconductor region 31 via the silicide region 51 (see FIG. 1); and the contact plug DP is connected to the second semiconductor region 33 via the silicide region 53 (see FIG. 1). The contact plugs SP and DP extend through the inter-layer insulating film 50 (see FIG. 1) and electrically connect the first and second semiconductor regions 31 and 33 with input/output lines (not illustrated) located on the inter-layer insulating film 50.

The semiconductor layer 30 further includes a sixth semiconductor region 39 of the second conductivity type. The sixth semiconductor region 39 is, for example, a body contact region. The sixth semiconductor region 39 is provided at a position facing the first and second semiconductor regions 31 and 33 in the plan view. A contact plug BP is connected to the sixth semiconductor region 39 via the silicide region 57 (see FIG. 3). The contact plug BP extends through the inter-layer insulating film 50 (see FIG. 1) and electrically connects the sixth semiconductor region 39 and a bias line (not illustrated) located on the inter-layer insulating film 50.

The draw-out portion GEX of the first control part GG extends between the first semiconductor region 31 and the sixth semiconductor region 39 and between the second semiconductor region 33 and the sixth semiconductor region 39 in the plan view.

The control electrode 40 further includes a fourth control part GB. The fourth control part GB is provided between the sixth semiconductor region 39 and the draw-out portion GEX of the first control part GG in the plan view. The draw-out portion GEX extends between the second control part GS and the fourth control part GB and between the third control part GD and the fourth control part GB. The fourth control part GB faces the draw-out portion GEX via a third insulating film 45. The fourth control part GB is electrically connected to the first control part GG at the contact portion GGC. The third insulating film 45 is, for example, a silicon oxide film.

Figure 3:
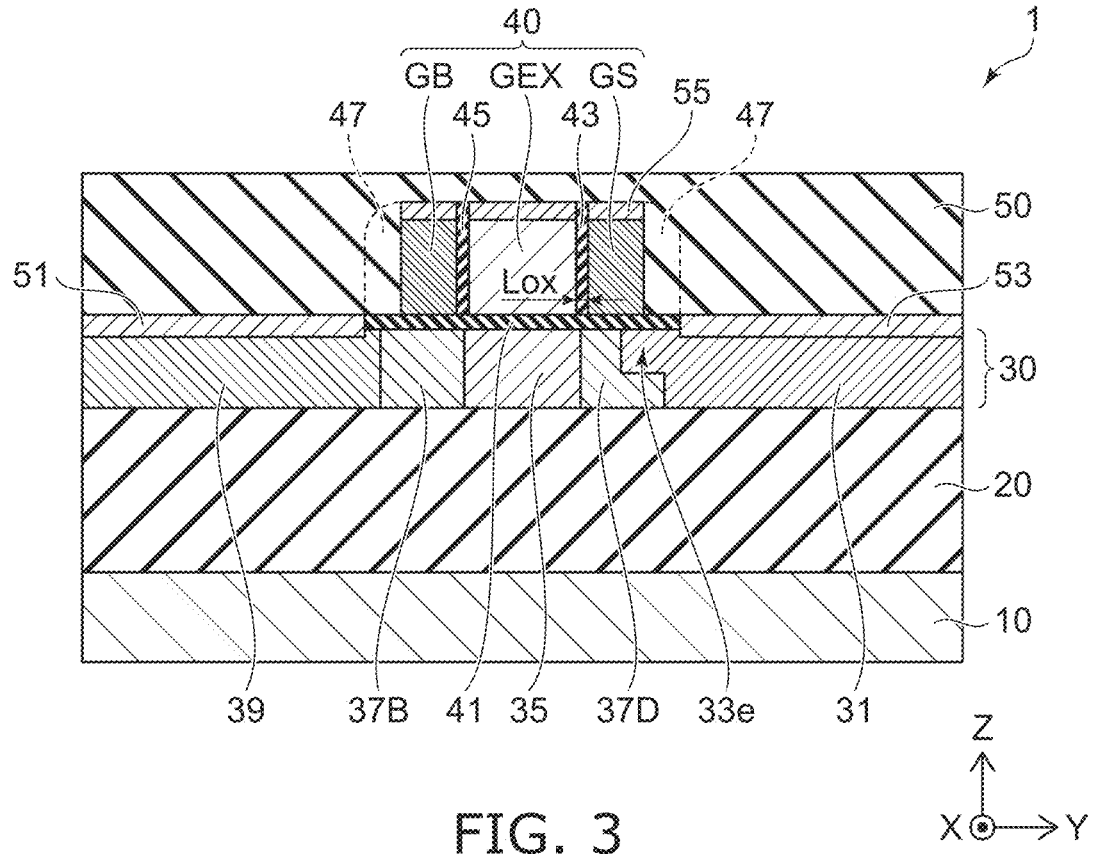
FIG. 3 is another schematic cross-sectional view showing the semiconductor device according to the embodiment.

FIG. 3 is another schematic cross-sectional view showing the semiconductor device 1 according to the embodiment. FIG. 3 is a cross-sectional view along line B-B shown in FIG. 2.

As shown in FIG. 3, the semiconductor layer 30 further includes a seventh semiconductor region 37B of the second conductivity type. The seventh semiconductor region 37B is provided between the third semiconductor region 35 and the sixth semiconductor region 39. The seventh semiconductor region 37B includes a second-conductivity-type impurity with a higher concentration than the concentration of the second-conductivity-type impurity in the third semiconductor region 35. The sixth semiconductor region 39 includes a second-conductivity-type impurity with a higher concentration than the concentration of the second-conductivity-type impurity in the seventh semiconductor region 37B.

The third semiconductor region 35 is positioned between the insulating layer 20 and the draw-out portion GEX of the first control part GG. The seventh semiconductor region 37B is positioned between the insulating layer 20 and the fourth control part GB. The silicide region 57 is provided on the sixth semiconductor region 39. The sixth semiconductor region 39 is electrically connected to the third semiconductor region 35 via the seventh semiconductor region 37B.

Figures 4A, 4B:
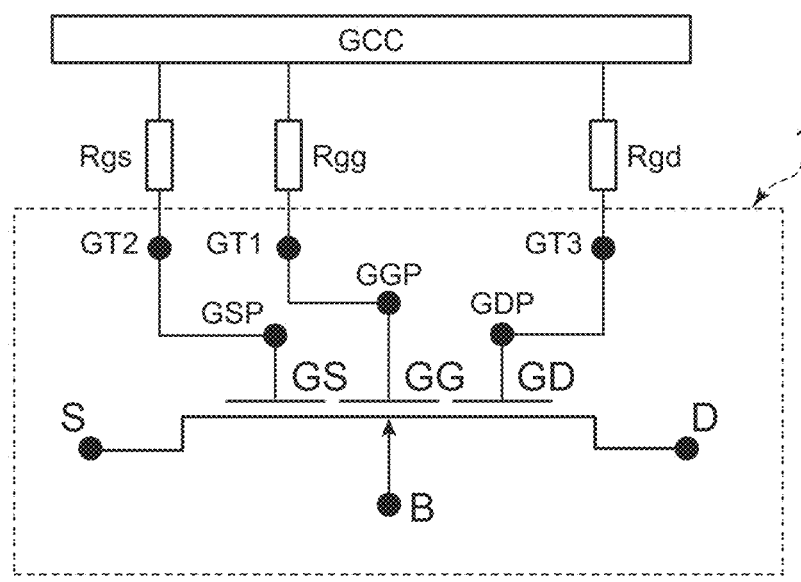
FIGS. 4A and 4B are a schematic view and a table showing an equivalent circuit and a control method of the semiconductor device according to the embodiment.

FIG. 4A is a schematic view showing an equivalent circuit of the semiconductor device 1 according to the embodiment. FIG. 4B illustrates a method for controlling the semiconductor device 1.

As shown in FIG. 4A, the semiconductor device 1 includes gate terminals GT1 to GT3. The semiconductor device 1 also includes a source terminal S, a drain terminal D, and a body terminal B. The gate terminal GT1 is electrically connected to the first control part GG via the contact plug GGP. The gate terminal GT2 is electrically connected to the second control part GS via the contact plug GSP. The gate terminal GT3 is electrically connected to the third control part GD via the contact plug GDP.

The source terminal S is electrically connected to the first semiconductor region 31 via the contact plug SP (see FIG. 2). The drain terminal D is electrically connected to the second semiconductor region 33 via the contact plug DP (see FIG. 2). The body terminal B is electrically connected to the sixth semiconductor region 39 via the contact plug BP (see FIG. 2).

The semiconductor device 1 is controlled by, for example, a gate control circuit GCC. The gate control circuit GCC is connected to the gate terminal GT1 via a gate resistance Rgg. Also, the gate control circuit GCC is connected to the gate terminal GT2 via the gate resistance Rgs and connected to the gate terminal GT3 via the gate resistance Rgd.

As shown in FIG. 4B, the source terminal S and the body terminal B are biased to, for example, 0 V in the on-state; and a high-frequency signal (RF) is input to the drain terminal D. The gate control circuit GCC outputs a gate voltage, e.g., 3 V, that is greater than a gate threshold voltage, and applies to the first, second, and third control parts GG, GS, and GD. Thereby, the high-frequency signal is transmitted from the drain terminal D to the source terminal S.

On the other hand, in the off-state, the source terminal S is biased to, for example, 0 V, and the body terminal B is biased to, for example, −3 V. A high-frequency signal (RF) is input to the drain terminal D. The gate control circuit GCC outputs a gate voltage of, for example, −3 V that is applied to the first control part GG, and lowers the voltages of the second and third control parts GS and GD to, for example, 0 V. The drain terminal D and the source terminal S are electrically blocked thereby, and the high-frequency signal is not transmitted to the source terminal S.

Figure 5A:
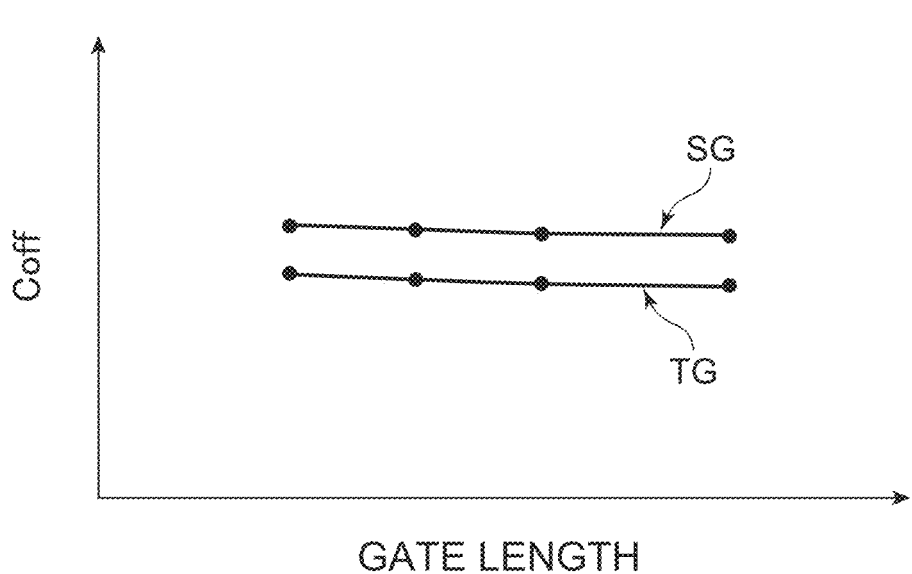
FIGS. 5A and 5B are graphs showing characteristics of the semiconductor device according to the embodiment.
Figure 5B:
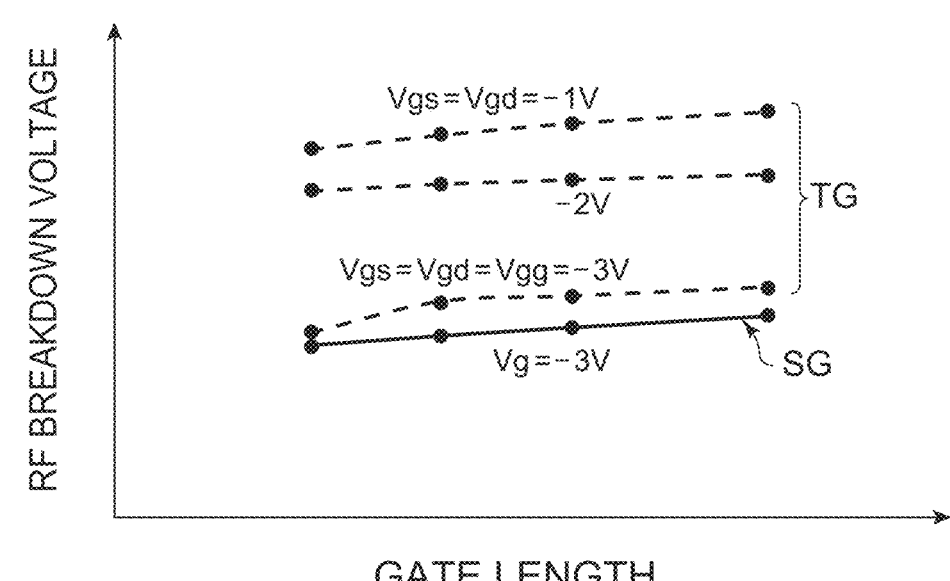

FIGS. 5A and 5B are graphs showing characteristics of the semiconductor device 1 according to the embodiment. FIG. 5A illustrates the relationship between a drain capacitance Coff and the gate length in the off-state. FIG. 5B illustrates the relationship between the gate length and the high-frequency breakdown voltage between the source terminal S and the drain terminal D. Here, the gate length is the X-direction width of the control electrode 40 (see FIG. 1).

In a high-frequency switching device, for example, when the RC time constant that is determined by the gate resistance and the gate capacitance is sufficiently greater than the high-frequency period, the gate has a substantially floating state, and Coff is small. In the example, a high frequency of 2 GHz is input, and the gate resistances Rgg, Rgs, and Rgd each are sufficiently high, i.e., not less than 1 MS).

"SG" shown in FIGS. 5A and 5B illustrates the characteristic of a semiconductor device according to a comparative example; and "TG" illustrates the characteristic of the semiconductor device 1 according to the embodiment. In the semiconductor device according to the comparative example, the control electrode is a continuous body and is not subdivided as shown in FIG. 1.

As shown in FIG. 5A, the semiconductor device 1 has Coff less than Coff of the semiconductor device according to the comparative example. Here, the gate resistances Rgg, Rgs, and Rgd each are 25 MS). A gate voltage Vgg is applied to the first control part GG; a gate voltage Vgs is applied to the second control parts GS; and a gate voltage Vgd is applied to the third control part GD. The gate voltage Vgg is –3 V; and the gate voltages Vgs and Vgd are, for example, 0 to 3 V. The gate voltage Vg that is same as the gate voltage Vgg (=–3 V) of the first control part GG is applied to the control electrode of the semiconductor device according to the comparative example.

Coff of the semiconductor device 1 is independent of the gate voltage Vgs (=Vgd) and is about 19% less than Coff of the semiconductor device according to the comparative example. Also, Coff is independent of the gate length.

As shown in FIG. 5B, the high-frequency breakdown voltage of the semiconductor device 1 is greater than the high-frequency breakdown voltage of the semiconductor device according to the comparative example. The high-frequency breakdown voltage of the semiconductor device 1 is dependent on the gate voltage Vgs (=Vgd) and decreases as the gate voltage Vgs approaches the gate voltage Vgg. The high-frequency breakdown voltage is not very dependent on the gate length at the long channel side.

Figure 6:
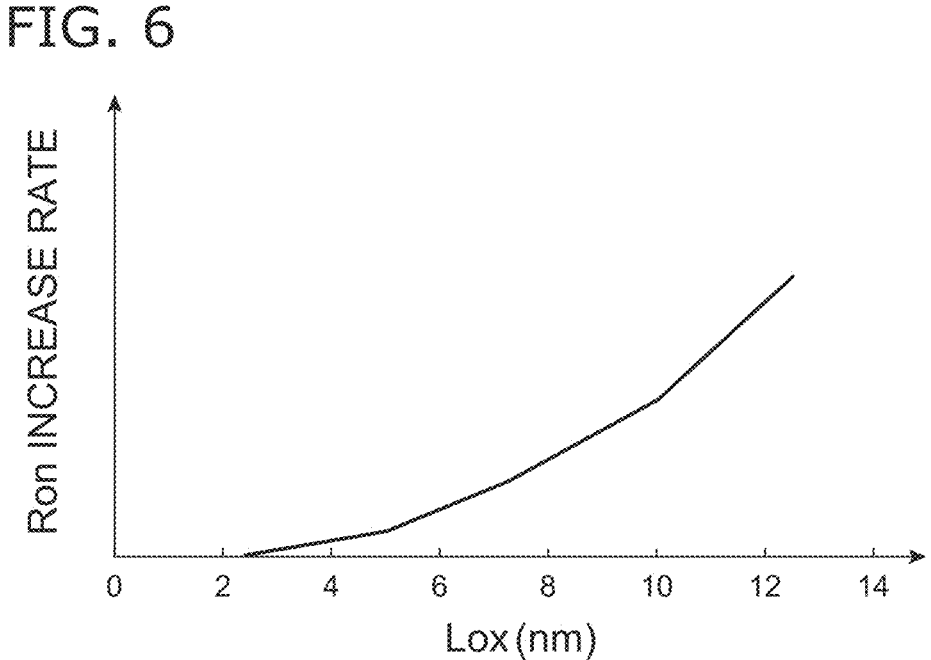
FIG. 6 is a graph showing another characteristic of the semiconductor device according to the embodiment.

FIG. 6 is a graph showing another characteristic of the semiconductor device 1 according to the embodiment. FIG. 6 illustrates the relationship between an on-resistance Ron and a film thickness Lox of the second insulating film 43 (see FIG. 1). The vertical axis is the increase rate of the on-resistance of the semiconductor device 1 with respect to the on-resistance of the semiconductor device according to the comparative example.

As shown in FIG. 6, the on-resistance Ron increases as the film thickness Lox increases. The on-resistance Ron increases, for example, about 1.3% when the film thickness Lox is 8 nm. Such an increase of the on-resistance Ron may be compensated by, for example, the reduction effect of Coff. That is, whereas the on-resistance Ron increases in the semiconductor device 1, the performance index of the high-frequency switching device, i.e., Ron×Coff, can be reduced by the large reduction effect of Coff. Thereby, it is possible to improve the switching performance.

Thus, in the semiconductor device 1 according to the embodiment, by providing the control electrode 40 that includes the first control part GG, the second control part GS, and the third control part GD, the high-frequency breakdown voltage is increased, and the switching performance is improved.

A method for manufacturing the semiconductor device 1 will now be described with reference to FIGS. 7A to 16C. FIGS. 7A to 16C are schematic views showing manufacturing processes of the semiconductor device 1 according to the embodiment. FIGS. 7A to 10C are cross-sectional views along line A-A shown in FIG. 2. FIGS. 11A to 12C are cross-sectional views along line C-C shown in FIG. 2. FIGS. 13A to 16C are partial plan views illustrating the front side of the semiconductor layer 30.

As shown in FIG. 7A, the first insulating film 41 is formed on the semiconductor layer 30. The semiconductor layer 30 includes a second-conductivity-type impurity with a low concentration. The first insulating film 41 is, for example, a silicon oxide film. The first insulating film 41 is formed by, for example, thermal oxidation of the semiconductor layer 30.

As shown in FIG. 7B, a conductive film 101 is formed on the first insulating film 41. The conductive film 101 is, for example, a polysilicon film. The conductive film 101 is formed using, for example, CVD (Chemical Vapor Deposition).

As shown in FIG. 7C, the first control part GG is formed by selectively removing the conductive film 101. The conductive film 101 is patterned using, for example, an etching mask formed by photolithography.

As shown in FIG. 8A, the fourth semiconductor region 37S and the fifth semiconductor region 37D are formed in the semiconductor layer 30. The fourth semiconductor region 37S and the fifth semiconductor region 37D are formed by ion-implanting a second-conductivity-type impurity, e.g., boron (B), using the first control part GG as a mask and activating the implanted impurity by heat treatment. The third semiconductor region 35 is formed between the fourth semiconductor region 37S and the fifth semiconductor region 37D. The fourth semiconductor region 37S and the fifth semiconductor region 37D may be formed after forming the second control part GS and the third control part GD (see FIG. 9C).

As shown in FIG. 8B, the second insulating film 43 is formed on the first control part GG. The second insulating film 43 is, for example, a silicon oxide film. The second insulating film 43 is formed by, for example, thermal oxidation of the first control part GG and covers the upper surface and the side surfaces of the first control part GG.

As shown in FIG. 8C, a conductive film 103 is formed on the first and second insulating films 41 and 43. The conductive film 103 is, for example, a polysilicon film. The conductive film 103 covers the first control part GG. The conductive film 103 has a Z-direction thickness that is less than the Z-direction thickness of the first control part GG. The conductive film 103 is formed using, for example, CVD.

Figures 9A, 9B, 9C:
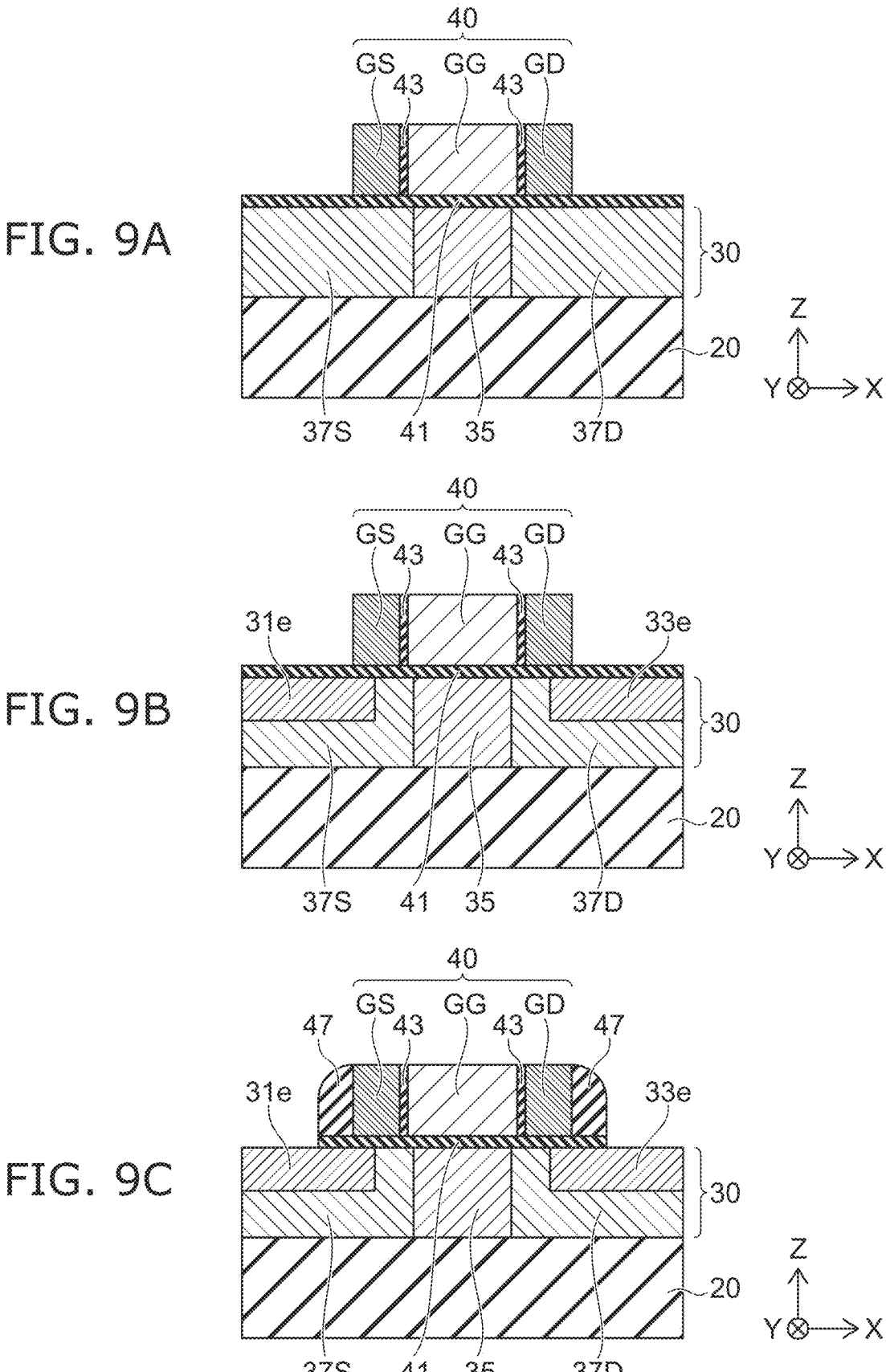

As shown in FIG. 9A, the conductive film 103 is selectively removed so that the portions of the conductive film 103 remain on the side surfaces of the first control part GG. The conductive film 103 is removed using, for example, RIE (Reactive Ion Etching). The control electrode 40 that includes the first control part GG, the second control part GS, and the third control part GD is formed thereby. The second control part GS and the third control part GD are formed on the side surfaces of the first control part GG with the second insulating film 43 interposed.

As shown in FIG. 9B, the extension portion 31e of the first semiconductor region 31 and the extension portion 33e of the second semiconductor region 33 are formed in semiconductor layer 30 at the two sides of the control electrode 40 (see FIG. 1). The extension portions 31e and 33e are formed by ion-implanting an impurity of the first conductivity type, e.g., arsenic (As), and activating the implanted impurity by heat treatment. At this time, the extension portion 31e is formed to extend under the second control part GS by increasing the ion implantation angle. Moreover, the extension portion 31e is formed on the fourth semiconductor region 37S; and the extension portion 33e is formed on the fifth semiconductor region 37D. In the plan view, the second control part GS overlaps the extension portion 31e; and the third control part GD overlaps the extension portion 33e. As the overlapping widths thereof increase, Coff becomes large. Therefore, the extension portion 31e and the extension portion 33e are preferably provided under the second control part GS and the third control part GD, respectively, so that the overlapping widths thereof are reduced.

As shown in FIG. 9C, the sidewalls 47 are formed on the side surfaces of the second and third control parts GS and GD. The sidewalls 47 are, for example, silicon nitride films. The sidewalls 47 are formed by, for example, using RIE to selectively remove the silicon nitride film covering the control electrode 40. At this time, the first insulating film 41 is removed around the control electrode 40, and the front surface of the semiconductor layer 30 is exposed.

Figures 10A, 10B, 10C:
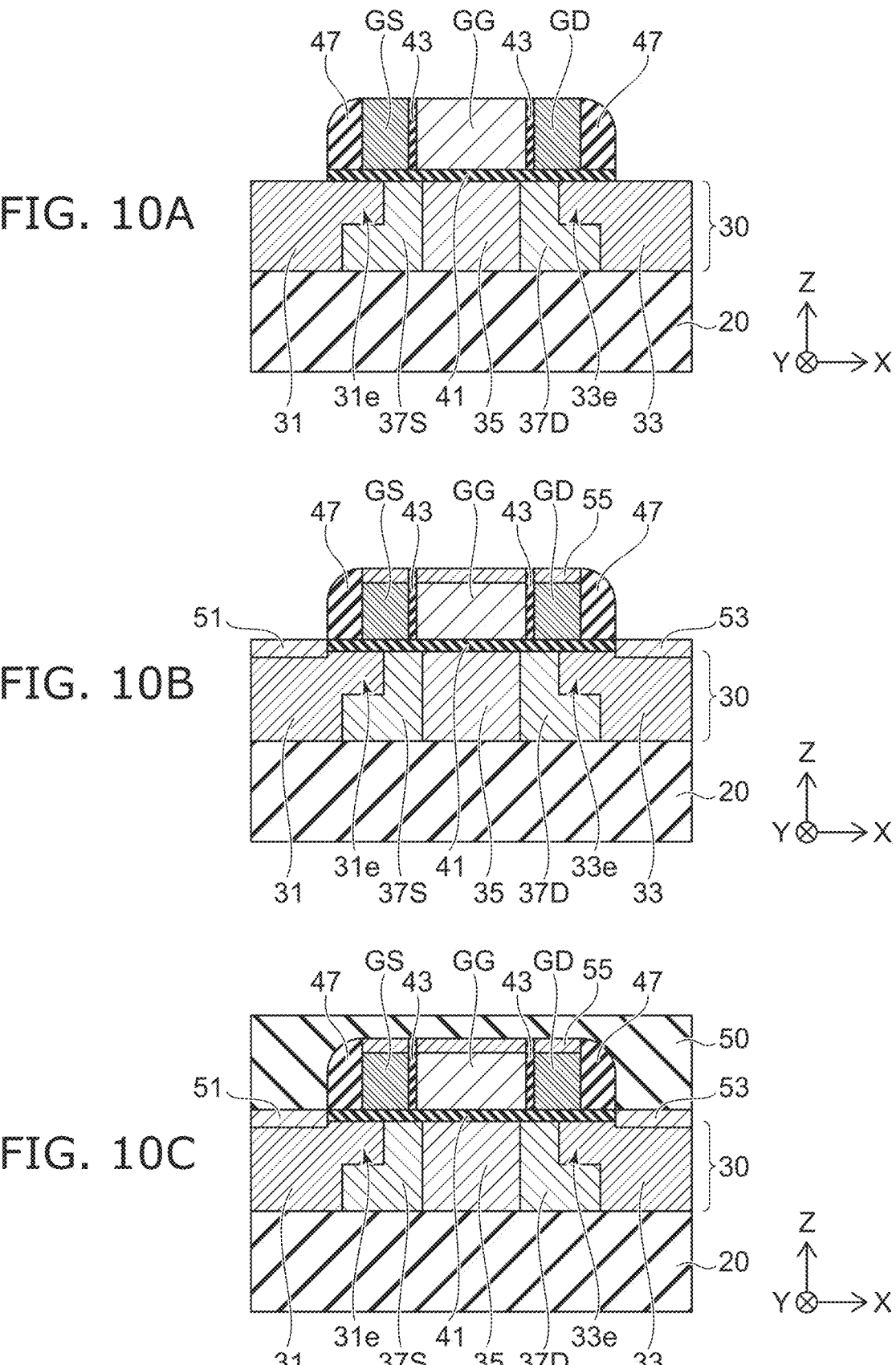

As shown in FIG. 10A, the first semiconductor region 31 and the second semiconductor region 33 are formed in the semiconductor layer 30 around the control electrode 40. The first semiconductor region 31 and the second semiconductor region 33 are formed by ion-implanting an impurity of the first conductivity type, e.g., arsenic (As), and activating the implanted impurity by heat treatment. The first semiconductor region 31 and the second semiconductor region 33 are extended by the heat treatment, and contact the insulating layer 20.

The fourth semiconductor region 37S is positioned between the first semiconductor region 31 and the third semiconductor region 35; and the fifth semiconductor region 37D is positioned between the second semiconductor region 33 and the third semiconductor region 35. The extension portion 31e of the first semiconductor region 31 extends between the fourth semiconductor region 37S and the first insulating film 41; and the extension portion 33e of the second semiconductor region 33 extends between the fifth semiconductor region 37D and the first insulating film 41.

As shown in FIG. 10B, the silicide region 51 is formed on the first semiconductor region 31; and the silicide region 53 is formed on the second semiconductor region 33. Also, the silicide region 55 is formed on the control electrode 40. The silicide regions 51, 53, and 55 are formed by depositing a metal film such as, for example, nickel (Ni), cobalt (Co), etc., on the exposed surface of the semiconductor layer 30 and on the control electrode 40 and by performing heat treatment.

As shown in FIG. 10C, the inter-layer insulating film 50 is formed to cover the silicide regions 51, 53, and 55. The inter-layer insulating film 50 covers the semiconductor layer 30 and the control electrode 40. The inter-layer insulating film 50 is, for example, a silicon oxide film. The inter-layer insulating film 50 is formed using, for example, CVD.

In the manufacturing processes described above, the first-conductivity-type impurity and the second-conductivity-type impurity also are ion-implanted into the control electrode 40. The first-conductivity-type impurity is implanted with, for example, a high dose when forming the first semiconductor region 31 and the second semiconductor region 33; and the control electrode 40 is provided with the second conductivity type.

FIGS. 11A to 12C are other schematic cross-sectional views showing manufacturing processes of the semiconductor device 1 according to the embodiment. FIGS. 11A to 12C illustrate the transition of the cross-sectional structure along line C-C shown in FIG. 2.

Figure 11A:
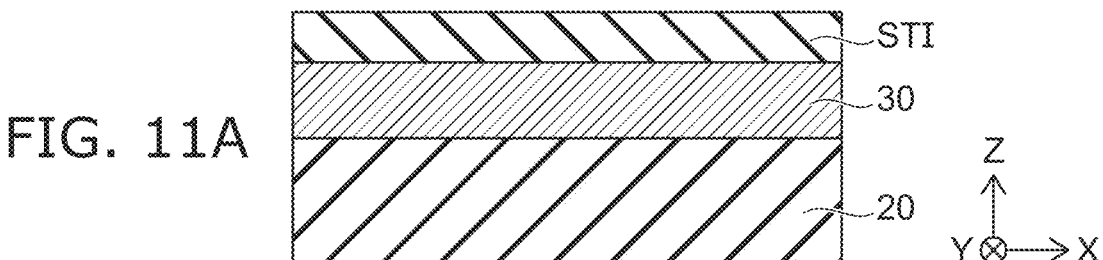

As shown in FIG. 11A, the STI is provided on the semiconductor layer 30 when the semiconductor layer 30 is provided with a large thickness. The STI is formed to have, for example, a greater thickness than the film thickness of the first insulating film 41. The STI is formed by, for example, thermal oxidation of the semiconductor layer 30. The STI is, for example, a silicon oxide film. On the other hand, when the semiconductor layer 30 is provided with a small thickness, e.g., not more than 100 nm, the insulating layer 20 is exposed by selectively removing the semiconductor layer 30 at the element separation region. Subsequently, an oxide film is formed by, for example, thermal oxidation of the semiconductor layer 30; and the STI is formed by filling an insulator such as a CVD oxide film or the like into the element separation region.

Figure 11B:
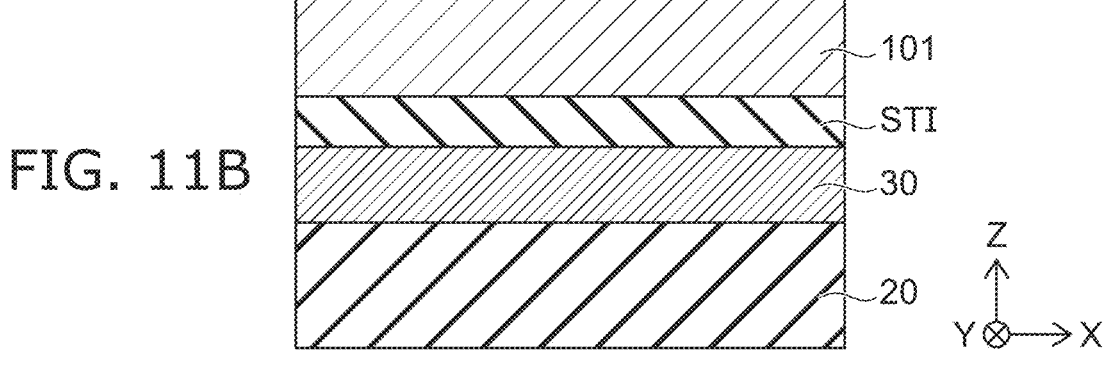

As shown in FIG. 11B, the conductive film 101 (see FIG. 7B) also is formed on the STI.

Figure 11C:
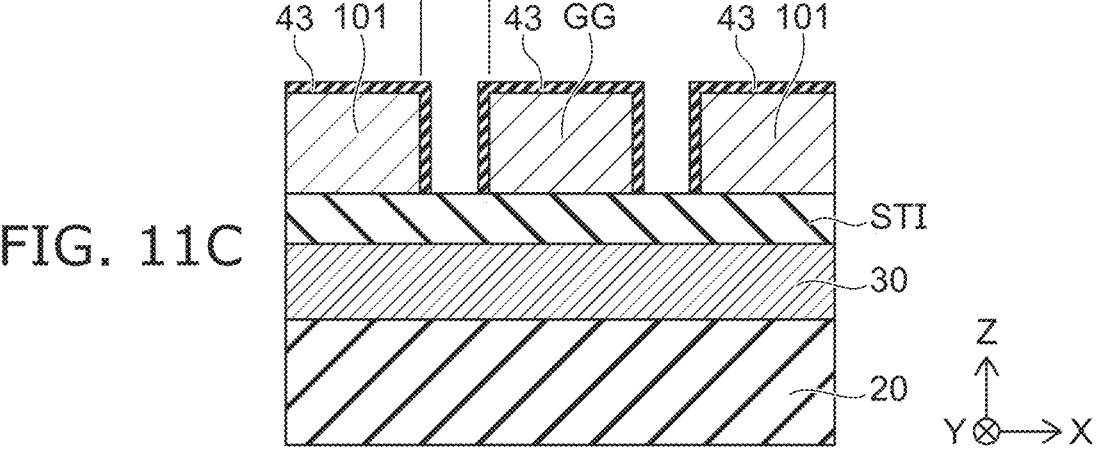

As shown in FIG. 11C, the second insulating film 43 is formed after forming the first control part GG by selectively removing the conductive film 101 (see FIG. 8B). At this time, the portions of the conductive film 101 that are to be the contact portion GSC and the contact portion GDC also remain on the STI. At this time, spacing Ws between the first control part GG and the remaining portion of the conductive film 101 is formed to be less than 2 times the film thickness of the conductive film 103 (see FIG. 8C).

Figures 12A, 12B, 12C:
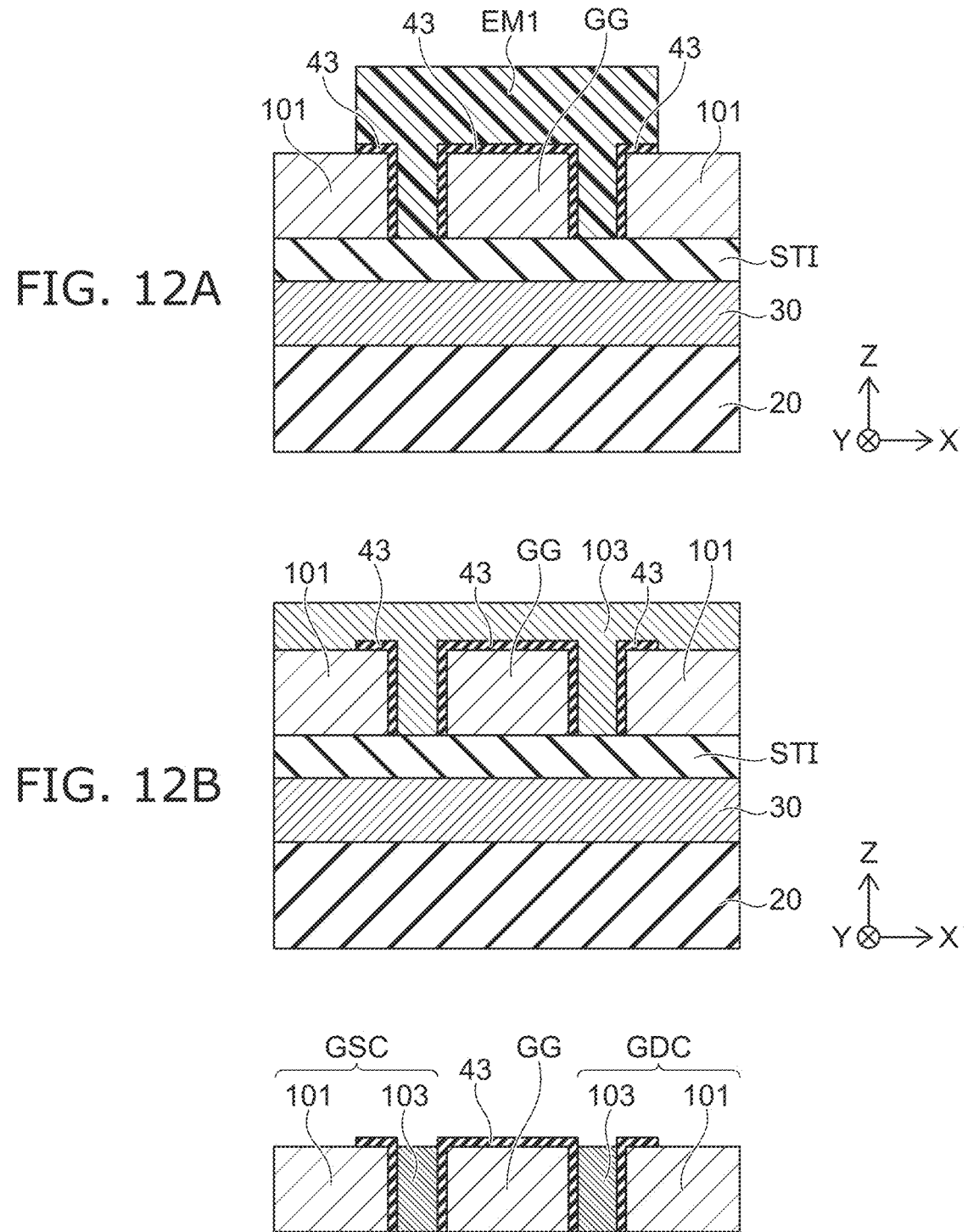

As shown in FIG. 12A, an etching mask EM1 is formed on the STI. The etching mask EM1 has, for example, an opening that partially exposes the conductive film 101; and the etching mask EM1 covers the other portions. The etching mask EM1 is, for example, a resist mask formed using photolithography. Then, the second insulating film 43 that covers the conductive film 101 is selectively removed using the etching mask EM1.

As shown in FIG. 12B, the conductive film 103 is formed to cover the first control part GG (see FIG. 8C). The conductive film 103 is formed to fill the spaces between the first control part GG and the conductive film 101 with the second insulating film 43 interposed.

As shown in FIG. 12C, the conductive film 103 is selectively removed so that the portions of the conductive film 103 filling the spaces between the first control part GG and the conductive film 101 remain. Also, the conductive film 103 is removed so that other portion (not illustrated) formed on the side surface of the conductive film 101 remains. Thereby, the contact portion GSC and the contact portion GDC are formed on the STI.

FIGS. 13A to 14C are schematic plan views showing manufacturing processes of the semiconductor device 1 according to the embodiment. FIGS. 13A to 14C are partial plan views showing the end portion GGE of the first control part GG. The second insulating film 43 that is on the first control part GG and on the conductive film 101 is not illustrated in FIGS. 13A to 14C.

As shown in FIG. 13A, the first control part GG is formed with the end portion GGE on the STI (see FIG. 8A). Also, the second insulating film 43 is formed to cover the end portion GGE of the first control part GG. The end portion GGE of the first control part GG extends between the remaining portions of the conductive film 101.

As shown in FIG. 13B, the second insulating film 43 that covers the conductive film 101 is selectively removed using the etching mask EM1 (see FIG. 12A).

As shown in FIG. 13C, after forming the conductive film 103 that covers the first control part GG and the conductive film 101 (see FIGS. 8C and 12B), the conductive film 103 is removed so that the portions that are on the side surfaces of the first control part GG and the conductive film 101 and fill the space between the first control part GG and the conductive film 101 remain. The conductive film 103 between the first control part GG and the conductive film 101 is electrically connected to the conductive film 101 via the portion formed on the side surface of the conductive film 101.

Figures 14A, 14B, 14C:
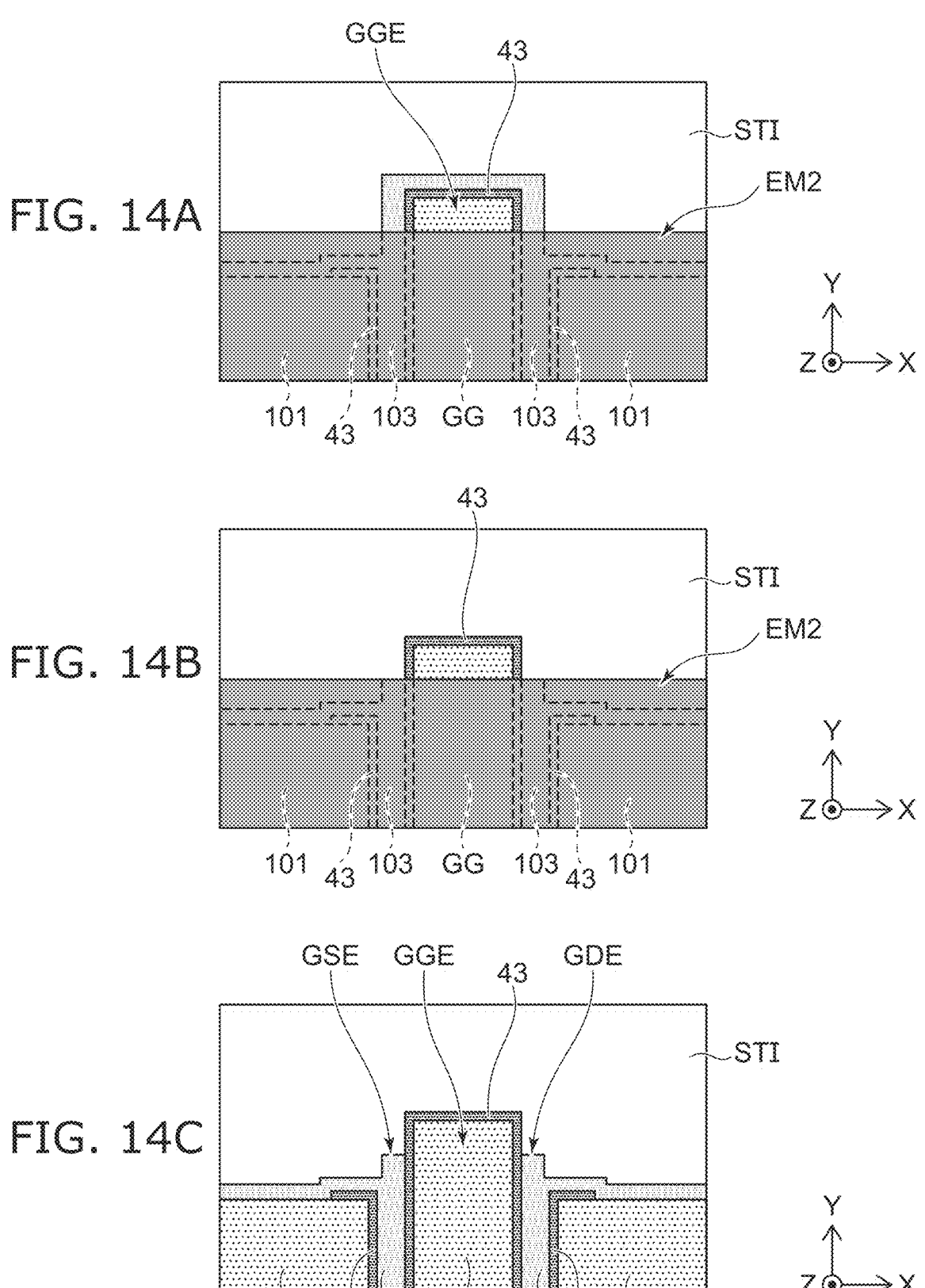

As shown in FIG. 14A, an etching mask EM2 is formed on the STI. The etching mask EM2 is formed so that the tip of the first control part GG is exposed. The etching mask EM2 is, for example, a photoresist and is formed using photolithography.

As shown in FIG. 14B, the conductive film 103 that is formed on the side surface of the tip of the first control part GG is selectively removed using the etching mask EM2. The conductive film 103 is removed by, for example, dry etching.

As shown in FIG. 14C, the second control part GS and the third control part GD are apart from each other by removing the conductive film 103 at the tip of the first control part GG. The end portion GSE of the second control part GS is apart from the end portion GDE of the third control part GD with the end portion GGE of the first control part GG interposed.

FIGS. 15A to 16C are other schematic plan views showing manufacturing processes of the semiconductor device 1 according to the embodiment. FIGS. 15A to 16C are partial plan views showing the contact portion GGC of the control electrode 40.

Figures 15A, 15B, 15C:
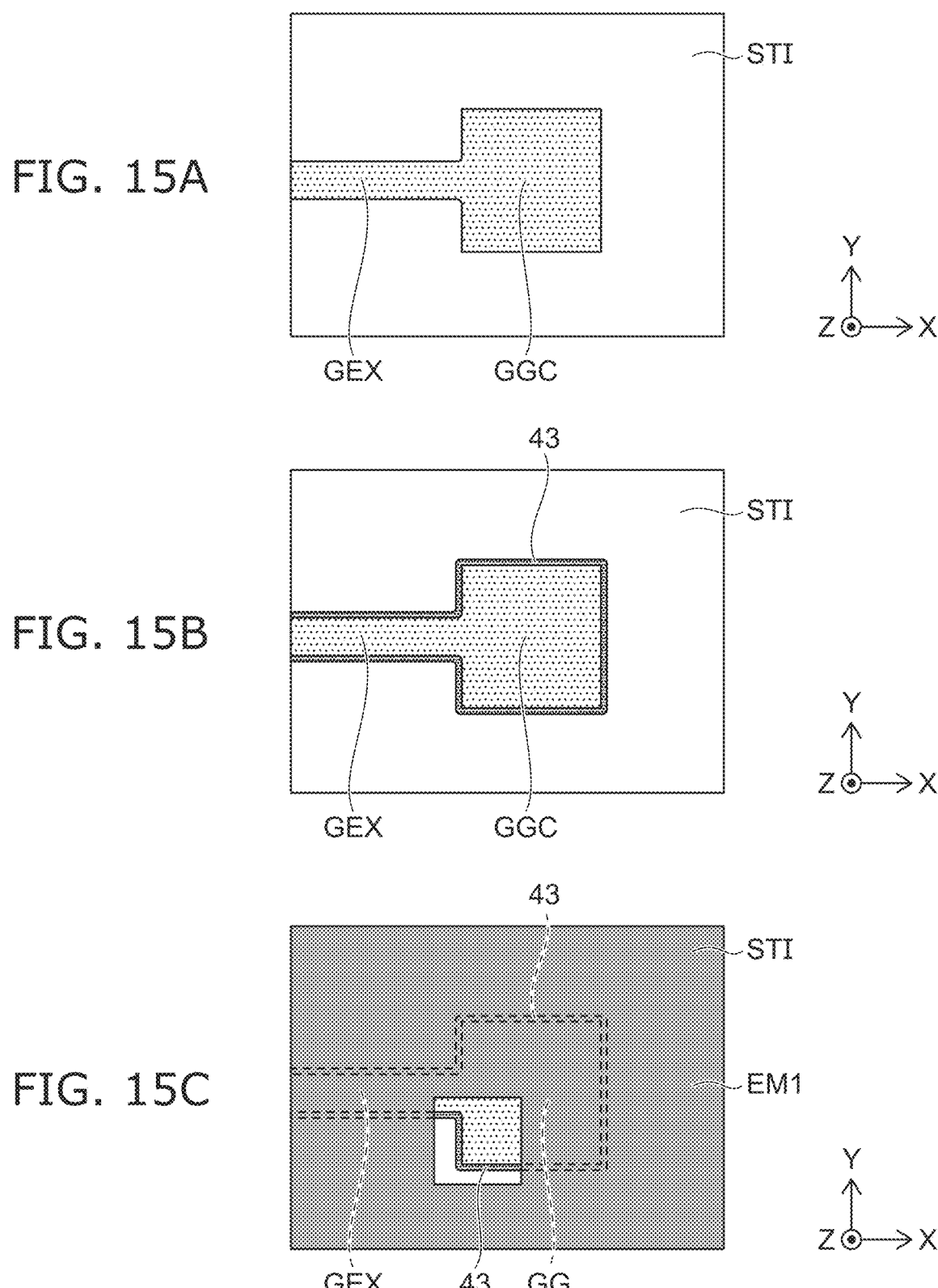

As shown in FIG. 15A, the contact portion GGC is formed on the STI by patterning the conductive film 101 (see FIG. 7C). The draw-out portion GEX is linked to the contact portion GGC.

As shown in FIG. 15B, the second insulating film 43 is formed by thermal oxidation of the first control part GG (see FIG. 8B). The second insulating film 43 covers the contact portion GGC and the draw-out portion GEX.

The etching mask EM1 is formed as shown in FIG. 15C (see FIG. 12A). The etching mask EM1 is formed so that a portion of the contact portion GGC is exposed.

Figures 16A, 16B, 16C:
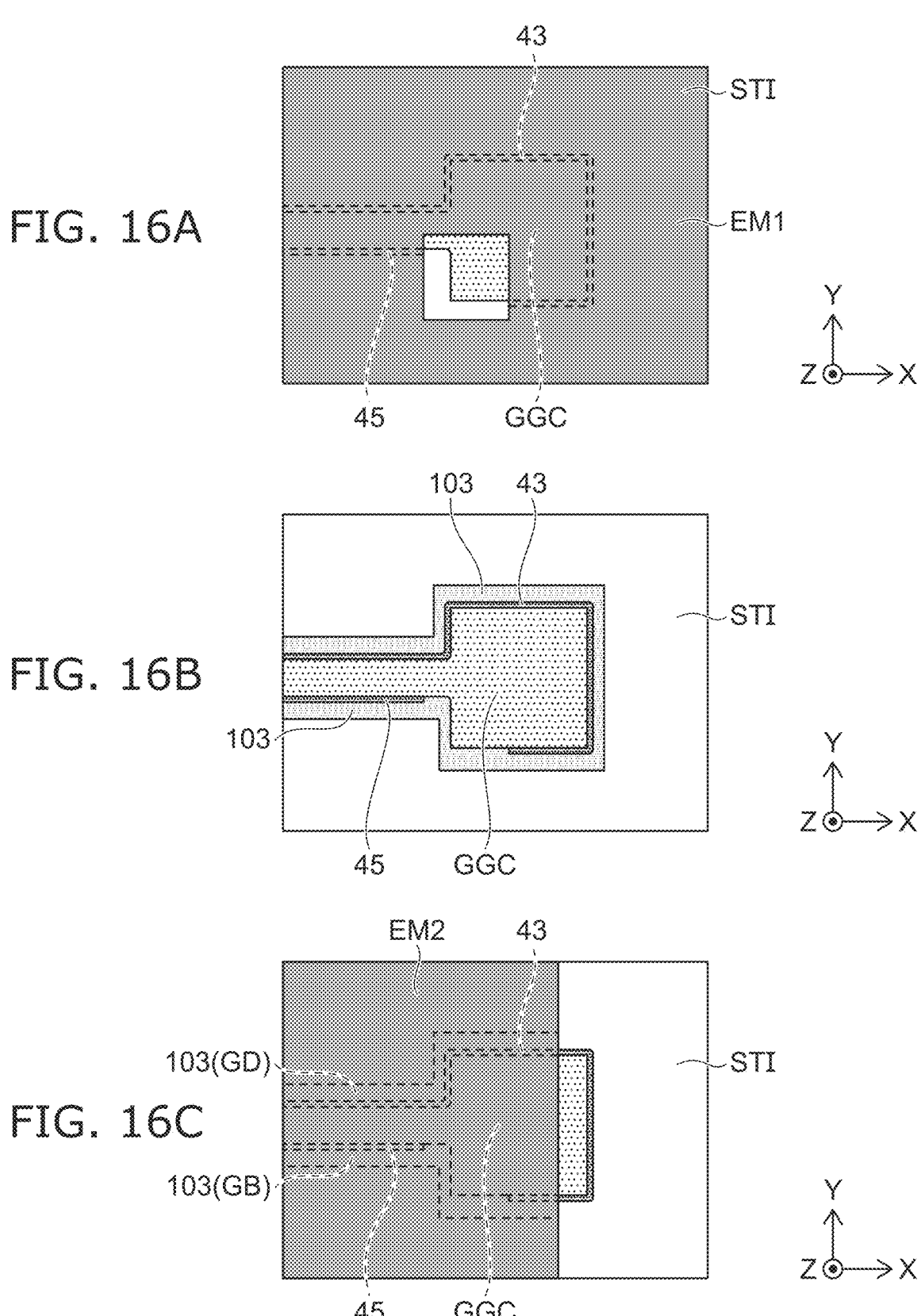

As shown in FIG. 16A, the second insulating film 43 is partially removed using the etching mask EM1. Hereinbelow, a portion of the second insulating film 43 separated by the etching is referred to as the third insulating film 45.

As shown in FIG. 16B, after forming the conductive film 103 that covers the first control part GG (see FIG. 8C), the conductive film 103 is removed so that the portions thereof formed on the side surfaces of the first control part GG remain (see FIG. 9A).

As shown in FIG. 16C, for example, the conductive film 103 is divided into the third control part GD and the fourth control part GB by partially removing the conductive film 103 formed on the side surface of the contact portion GGC by using the etching mask EM2.

The fourth control part GB faces the draw-out portion GEX via the third insulating film 45. The fourth control part GB is electrically connected to the draw-out portion GEX at the contact portion GGC.

The method for manufacturing the semiconductor device 1 is described with reference to FIGS. 7A to 16C, but the embodiment is not limited to the example above.

Figures 17, 18:
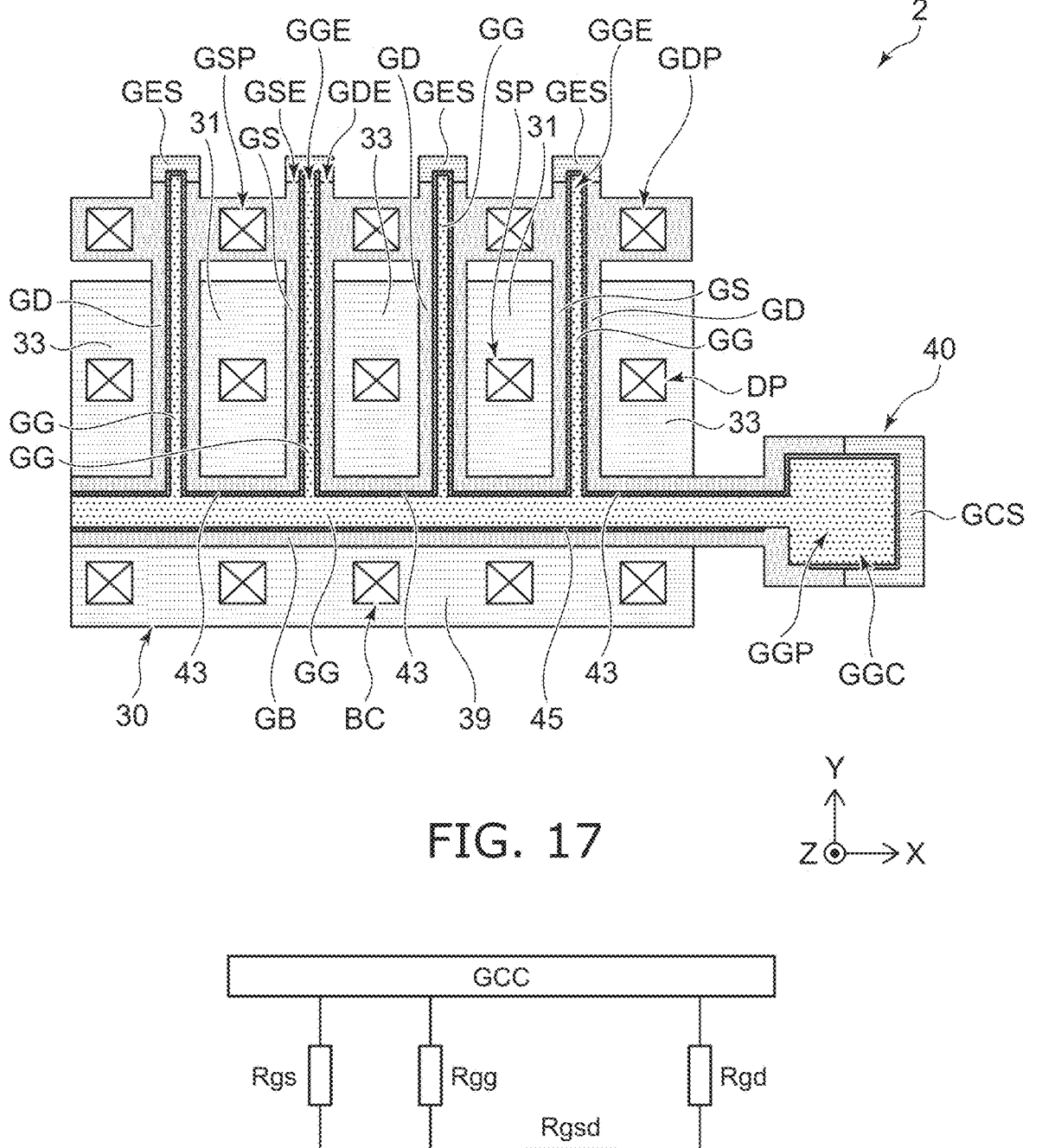
FIG. 17 is a schematic plan view showing a semiconductor device according to a modification of the embodiment.
FIG. 18 is a schematic view showing an equivalent circuit of the semiconductor device according to the modification of the embodiment.

FIG. 17 is a schematic plan view showing a semiconductor device 2 according to a modification of the embodiment. FIG. 17 is a plan view showing the control electrode 40 on the semiconductor layer 30. In the example, the control electrode also includes the first control part GG, the second control part GS, the third control part GD, and the fourth control part GB.

As shown in FIG. 17, the control electrode 40 includes a separating end GES of the second conductivity type located at the tip on the STI. The separating end GES faces the end portion GGE of the first control part GG via the second insulating film 43. In such a case, the first control part GG, the second control part GS, and the third control part GD are provided with the first conductivity type. The separating end GES is linked to the end portion GSE of the second control part GS and the end portion GDE of the third control part GD.

The separating end GES is formed in the process shown in FIG. 14A by ion-implanting a second-conductivity-type impurity, e.g., boron (B), without removing the conductive film 103. The separating end GES includes a second-conductivity-type impurity with a lower concentration than the concentrations of the first-conductivity-type impurities in the second and third control parts GS and GD.

The control electrode 40 includes a parasitic MOS transistor including the separating end GES at the tip on the STI. In other words, the second control part GS and the third control part GD serve as the source and the drain of the parasitic MOS transistor, respectively; and the first control part GG serves as the gate of the parasitic MOS transistor.

When the semiconductor device 2 is in the on-state, the first, second, and third control parts GG, GS, and GD are biased to, for example, 3 V. Therefore, even when the parasitic MOS transistor is in the on-state, there is no influence thereof on the switching characteristics. On the other hand, when the semiconductor device 2 is in the off-state, the first control part GG is biased to, for example, −3 V; and the second control part GS and the third control part GD each are biased to 0 V. Accordingly, in the parasitic MOS transistor, an inversion layer of the first conductivity type is not induced at the interface between the separating end GES and the second insulating film 43; and the parasitic MOS transistor is in the off-state. Thus, the second control part GS and the third control part GD are substantially separated from each other by the separating end GES.

The control electrode 40 further includes a separating portion GCS of the second conductivity type provided along the outer edge of the contact portion GGC. The separating portion GCS faces the contact portion GGC via the second insulating film 43. The separating portion GCS is linked to, for example, the third and fourth control parts GD and GB.

When forming the sixth semiconductor region 39A, the second conductivity type impurity is ion-implanted into the fourth control part GB. Therefore, the fourth control part GB is provided with the second conductivity type. The fourth control part GB is electrically connected to the first control part GG via the silicide region 55 provided on the fourth control part GB, the contact portion GGC and the first control part GG (see FIG. 10B).

The separating portion GCS is formed without removing the conductive film 103 on the side surface of the contact portion GGC in the process shown in FIG. 16C, and formed by ion-implanting a second-conductivity-type impurity, e.g., boron (B) into the conductive film 103.

By providing the separating portion GCS, the control electrode 40 includes a parasitic diode at the outer edge of the contact portion GGC. In other words, a p-n junction is included between the third control part GD of the first conductivity type and the separating portion GCS of the second conductivity type. The separating portion GCS is electrically connected to the first control part GG via the fourth control part GB.

When the semiconductor device 2 is in the on-state, the first, second, and third control parts GG, GS, and GD are biased to, for example, 3V. Therefore, a current does not flow through the parasitic diode. On the other hand, when the semiconductor device 2 is in the off-state, the first control part GG is biased to, for example, −3 V; and the second control part GS and the third control part GD each are biased with 0 V. Accordingly, the parasitic diode is reverse biased. Thus, the third control part GD and the fourth control part GB are substantially separated from each other by the separating portion GCS.

FIG. 18 is a schematic view showing an equivalent circuit of the semiconductor device 2 according to the modification of the embodiment. As shown in FIG. 18, the semiconductor device 2 also includes the gate terminals GT1 to GT3, the source terminal S, the drain terminal D, and the body terminal B.

The gate control circuit GCC is connected to the gate terminal GT1 via the gate resistance Rgg. Also, the gate control circuit GCC is connected to the gate terminal GT2 via the gate resistance Rgs and connected to the gate terminal GT3 via the gate resistance Rgd. In the example, a parasitic resistance Rgsd occurs between the gate terminal GT2 and the gate terminal GT3.

The parasitic resistance Rgsd is the source-drain resistance of the parasitic MOS transistor located at the tip of the control electrode 40. In other words, by providing the separating end GES, the second control part GS and the third control part GD are not completely isolated electrically; and the parasitic resistance Rgsd occurs between the second control part GS and the third control part GD. The parasitic resistance Rgsd is, for example, a high resistance of not less than 1 MS).

Figure 19A:
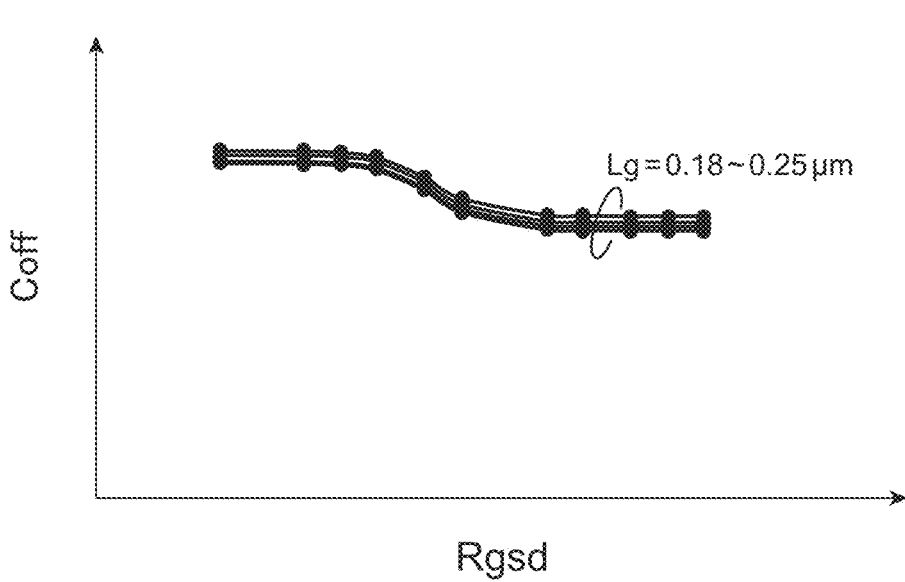
FIGS. 19A and 19B are graphs showing characteristics of the semiconductor device according to the modification of the embodiment.
Figure 19B:
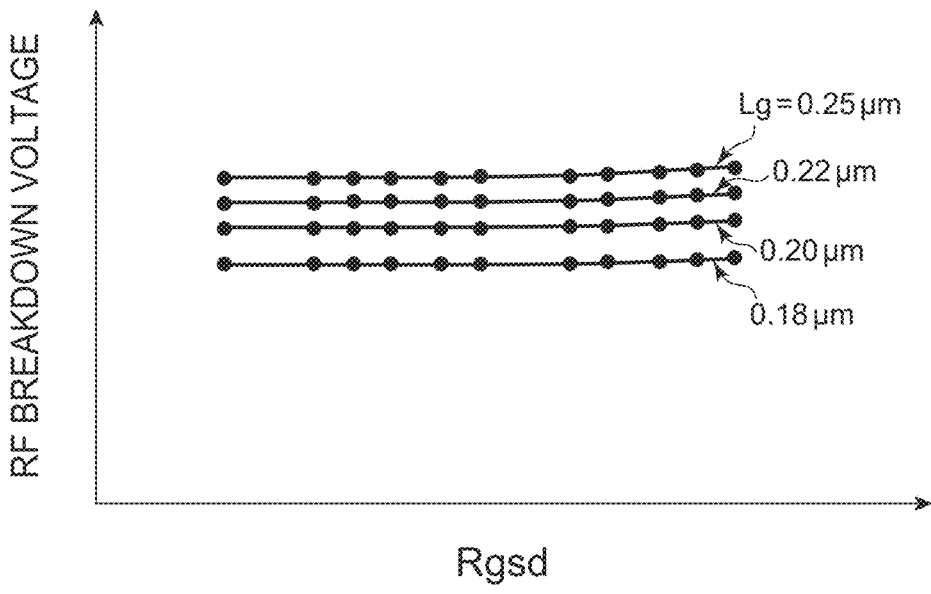

FIGS. 19A and 19B are graphs showing characteristics of the semiconductor device 2 according to the modification of the embodiment. FIG. 19A illustrates the relationship between Coff and the parasitic resistance Rgsd. FIG. 19B illustrates the relationship between the high-frequency breakdown voltage and the parasitic resistance Rgsd. FIGS. 19A and 19B show Coff and the high-frequency breakdown voltage when the gate length is 0.18 to 0.25 micrometers.

Here, the gate resistances Rgg, Rgs, and Rgd each are 25 MS). In the off-state, the gate voltage Vgg of, for example, −3 V is applied to the first control part GG, and the gate voltages Vgs and Vgd of, for example, 0 V are applied to the second and third control parts GS and GD.

As shown in FIG. 19A, when the parasitic resistance Rgsd is, for example, not less than 1 MS), Coff is effectively reduced. Also, it can be seen that Coff is independent of the gate length.

In FIG. 19B, the high-frequency breakdown voltage is independent of the parasitic resistance Rgsd. The high-frequency breakdown voltage increases as the gate length increases. The high-frequency breakdown voltage shown in FIG. 19B has a maximum when the gate length is 0.25 micrometers, but the maximum value is substantially equal to the maximum value of the high-frequency breakdown voltage shown in FIG. 58.

Thus, when the second control part GS and the third control part GD are configured to be separated from each other by the separating end GES, the switching characteristics are also improved, and the high-frequency breakdown voltage is increased.

The semiconductor device according to the embodiments includes the following aspect.

Note 1: A semiconductor device, comprising:

an insulating layer;

a semiconductor layer provided on the insulating layer, the semiconductor layer including a first semiconductor region of a first conductivity type, a second semiconductor region of the first conductivity type and a third semiconductor region of a second conductivity type, the second semiconductor region being apart from the first semiconductor region, the third semiconductor region located between the first semiconductor region and the second semiconductor region, the first to third semiconductor regions being arranged in a first direction along an interface between the insulating layer and the semiconductor layer; and a control electrode provided on the semiconductor layer with a first insulating film interposed, the control electrode being electrically insulated from the semiconductor layer by the first insulating film, the control electrode including first to third control parts arranged in the first direction, the first control part being located between the second control part and the third control part, the first control part being electrically insulated from the second and third control parts by a second insulating film, the third semiconductor region being positioned between the insulating layer and the first control part.

Note 2: The device according to note 1, wherein the semiconductor layer further includes a fourth semiconductor region of the second conductivity type and a fifth semiconductor region of the second conductivity type, the fourth semiconductor region being located between the first semiconductor region and the third semiconductor region, the fifth semiconductor region being located between the second semiconductor region and the third semiconductor region, and the fourth semiconductor region and the fifth semiconductor region include a second-conductivity-type impurity with a higher concentration than a second-conductivity-type impurity of the third semiconductor region.

Note 3: The device according to note 2, wherein the fourth semiconductor region is positioned between the insulating layer and the second control part of the control electrode; and the fifth semiconductor region is positioned between the insulating layer and the third control part of the control electrode.

Note 4: The device according to note 3, wherein the first semiconductor region includes a first extension portion extending along the first insulating film, the first extension portion being provided between the insulating layer and the second control part of the control electrode;

the second semiconductor region includes a second extension portion extending along the first insulating film, the second extension portion being provided between the insulating layer and the third control part of the control electrode;

the fourth semiconductor region is positioned between the third semiconductor region and the first extension portion of the first semiconductor region; and the fifth semiconductor region is positioned between the third semiconductor region and the second extension portion of the second semiconductor region.

Note 5: The device according to note 1, wherein the first semiconductor region of the semiconductor layer includes a first extension portion extending along the first insulating film, the first extension portion being provided between the insulating layer and the second control part of the control electrode; and the second semiconductor region of the semiconductor layer includes a second extension portion extending along the first insulating film, the second extension portion being provided between the insulating layer and the third control part of the control electrode.

Note 6: The device according to any one of notes 1 to 5, wherein the first semiconductor region and the second semiconductor region contact the insulating layer.

Note 7: The device according to any one of notes 1 to 6, wherein the semiconductor layer further includes a sixth semiconductor region of the second conductivity type, the sixth semiconductor region being linked to the third semiconductor region, the first to third semiconductor regions and the sixth semiconductor region being arranged along the interface between the insulating layer and the semiconductor layer, the sixth semiconductor region extending in the first direction, each of the first to third semiconductor regions and the sixth semiconductor region being arranged in a second direction orthogonal to the first direction.

Note 8: The device according to note 7, further comprising an insulating region provided above the insulating layer, wherein the insulating region surrounds the first to sixth semiconductor regions; and the control electrode extends in the second direction and includes an end portion positioned on the insulating region.

Note 9: The device according to note 8, wherein the control electrode includes first to third contact portions provided on the insulating region; and the first to third control parts of the control electrode are electrically connected to the first to third contact portions, respectively.

Note 10: The device according to note 8 or 9, wherein the second and third control parts of the control electrode are apart from each other at the end portion on the insulating region.

Note 11: The device according to note 9, wherein the control electrode includes a link portion positioned at the end portion on the insulating region, the link portion facing the first control part via the second insulating film and linking the second control part and the third control part;

the first to third control parts each includes a first conductivity type impurity, the first to third control parts being provided with the first conductivity type; and the link portion includes a second conductivity type impurity, the link portion being provided with the second conductivity type.

Note 12: The device according to note 11, wherein the link portion of the control electrode includes the second-conductivity-type impurity with a lower concentration than a concentration of the first-conductivity-type impurity in the second and third control parts.

Note 13: The device according to any one of notes 8 to 10, wherein the control electrode includes a draw-out portion provided on the sixth semiconductor region with the first insulating film interposed, the draw-out portion being electrically connected to the first control part; and the first contact portion is linked to the draw-out portion.

Note 14: The device according to note 13, wherein the draw-out portion of the control electrode extends in the first direction.

Note 15: The device according to note 14, wherein the control electrode further includes a fourth control part linked to the first control part; the draw-out portion extends between the second control part and the fourth control part and between the third control part and the fourth control part; and the fourth control part is linked to the first control part at the first contact portion.

Note 16: The device according to note 15, wherein the first to third control parts of the control electrode are provided with the first conductivity type; and the fourth control part is provided with the second conductivity type.

Note 17: The device according to note 16, wherein the fourth control part of the control electrode extends along an outer edge of the first contact portion and is linked to the second control part or the third control part.

Note 18: The device according to note 16 or 17, further comprising a silicide region provided on the control electrode, wherein the fourth control part being electrically connected to the first control part via the silicide region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of embodiments described herein may be made without departing from the spirit of the inventions. The accompanying claims and their equivalents are intended to cover such forms or modifications as would fall within the scope and overview of the invention.

What is claimed is:

1. A semiconductor device, comprising:

an insulating layer;

a semiconductor layer provided on the insulating layer, the semiconductor layer including a first semiconductor region of a first conductivity type, a second semiconductor region of the first conductivity type, a third semiconductor region of a second conductivity type, a fourth semiconductor region of the second conductivity type, and a fifth semiconductor region of the second conductivity type, the second semiconductor region being separated from the first semiconductor region, the third semiconductor region being located between the first semiconductor region and the second semiconductor region, the first to third semiconductor regions being aligned in a first direction along an interface between the insulating layer and the semiconductor layer, the fourth semiconductor region being located between the first and third semiconductor regions, the fifth semiconductor region being located between the second and third semiconductor regions, the fourth and fifth semiconductor regions each including a second-conductivity-type impurity with a higher concentration than a second-conductivity-type impurity of the third semiconductor region; and a control electrode provided on the semiconductor layer with a first insulating film interposed, the control electrode being electrically insulated from the semiconductor layer by the first insulating film, the control electrode including first to third control parts aligned in the first direction, the first control part being located between the second control part and the third control part, the first control part being electrically insulated from the second and third control parts by a second insulating film, the third semiconductor region being positioned between the insulating layer and the first control part, the fourth semiconductor region being positioned between the insulating layer and the second control part, the fifth semiconductor region being positioned between the insulating layer and the third control part.

2. The device according to claim 1, wherein the first semiconductor region includes a first extension portion extending along the first insulating film, the first extension portion being provided between the insulating layer and the second control part of the control electrode, the second semiconductor region includes a second extension portion extending along the first insulating film, the second extension portion being provided between the insulating layer and the third control part of the control electrode, the fourth semiconductor region is positioned between the third semiconductor region and the first extension portion of the first semiconductor region, and the fifth semiconductor region is positioned between the third semiconductor region and the second extension portion of the second semiconductor region.

3. The device according to claim 1, wherein the first semiconductor region of the semiconductor layer includes a first extension portion extending along the first insulating film, the first extension portion being provided between the insulating layer and the second control part of the control electrode, and the second semiconductor region of the semiconductor layer includes a second extension portion extending along the first insulating film, the second extension portion being provided between the insulating layer and the third control part of the control electrode.

4. The device according to claim 1, wherein the first semiconductor region and the second semiconductor region contact the insulating layer.

5. A semiconductor device, comprising:

an insulating layer;

a semiconductor layer provided on the insulating layer, the semiconductor layer including a first semiconductor region of a first conductivity type, a second semiconductor region of the first conductivity type, a third semiconductor region of a second conductivity type, and a sixth semiconductor region of the second conductivity type, the second semiconductor region being separated from the first semiconductor region, the third semiconductor region being located between the first and second semiconductor regions, the first to third semiconductor regions being aligned in a first direction along an interface between the insulating layer and the semiconductor layer, the sixth semiconductor region being electrically connected to the third semiconductor region, the first to third semiconductor regions and the sixth semiconductor region being aligned along the interface between the insulating layer and the semiconductor layer, the sixth semiconductor region extending in the first direction, the first and sixth semiconductor regions being aligned in a second direction orthogonal to the first direction, the second and sixth semiconductor regions being aligned in the second direction, the third and sixth semiconductor regions being aligned in the second direction; and a control electrode provided on the semiconductor layer with a first insulating film interposed, the control electrode being electrically insulated from the semiconductor layer by the first insulating film, the control electrode including first to third control parts aligned in the first direction, the first control part being located between the second control part and the third control part, the first control part being electrically insulated from the second and third control parts by a second insulating film, the third semiconductor region being positioned between the insulating layer and the first control part.

6. The device according to claim 5, further comprising:

an insulating region provided above the insulating layer in a third direction orthogonal to the first and second directions, the insulating region surrounding the first, second, third, and sixth semiconductor regions, the control electrode extending in the second direction and including an end portion positioned on the insulating region.

7. The device according to claim 6, wherein the control electrode includes first to third contact portions provided on the insulating region, the first to third control parts of the control electrode being electrically connected to the first to third contact portions, respectively.

8. The device according to claim 6, wherein the second and third control parts of the control electrode are apart from each other at the end portion on the insulating region.

9. The device according to claim 7, wherein the control electrode includes a link portion positioned at the end portion on the insulating region, the link portion facing the first control part via the second insulating film and linking the second control part and the third control part, the first to third control parts each being provided with the first conductivity type, and the link portion being provided with the second conductivity type.

10. The device according to claim 9, wherein the link portion of the control electrode includes a second-conductivity-type impurity with a lower concentration than a concentration of a first-conductivity-type impurity in the second and third control parts.

11. The device according to claim 6, wherein the control electrode includes a draw-out portion provided on the sixth semiconductor region with the first insulating film interposed, the draw-out portion being electrically connected to the first control part, and a first contact portion is linked to the draw-out portion.

12. The device according to claim 11, wherein the draw-out portion of the control electrode extends in the first direction.

13. The device according to claim 12, wherein the control electrode further includes a fourth control part linked to the first control part, the draw-out portion extends between the second control part and the fourth control part and between the third control part and the fourth control part, and the fourth control part is linked to the first control part at the first contact portion.

14. The device according to claim 13, wherein the first to third control parts of the control electrode are each provided with the first conductivity type, and the fourth control part is provided with the second conductivity type.

15. The device according to claim 14, wherein the fourth control part of the control electrode extends along an outer edge of the first contact portion and is linked to the second control part or the third control part.

16. The device according to claim 14, further comprising:

a silicide region provided on the control electrode, the fourth control part being electrically connected to the first control part via the silicide region.

* * * * *